US009461051B2

(12) United States Patent
Park et al.

(10) Patent No.: US 9,461,051 B2
(45) Date of Patent: Oct. 4, 2016

(54) METHODS OF FORMING ELECTRONIC DEVICES HAVING PADS USING FIRST AND SECOND MASKS

(71) Applicants: Je-Min Park, Suwon-si (KR);
Seok-Hyun Lim, Seoul (KR);
Tae-Yong Song, Seoul (KR);
Hyun-Chul Yoon, Seongnam-si (KR);
Yoo-Sang Hwang, Suwon-si (KR);
Hyeon-Ok Jung, Daejeon (KR)

(72) Inventors: Je-Min Park, Suwon-si (KR);
Seok-Hyun Lim, Seoul (KR);
Tae-Yong Song, Seoul (KR);
Hyun-Chul Yoon, Seongnam-si (KR);
Yoo-Sang Hwang, Suwon-si (KR);
Hyeon-Ok Jung, Daejeon (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 14/847,324

(22) Filed: Sep. 8, 2015

(65) Prior Publication Data
US 2016/0027787 A1  Jan. 28, 2016

Related U.S. Application Data

(63) Continuation of application No. 14/105,581, filed on Dec. 13, 2013, now abandoned.

(30) Foreign Application Priority Data

Jun. 20, 2013  (KR) .................... 10-2013-0070688

(51) Int. Cl.
*H01L 27/108* (2006.01)
*H01L 21/3213* (2006.01)
*H01L 21/768* (2006.01)
*H01L 21/033* (2006.01)
*H01L 21/311* (2006.01)

(52) U.S. Cl.
CPC ..... *H01L 27/10855* (2013.01); *H01L 21/0337* (2013.01); *H01L 21/31144* (2013.01); *H01L 21/32139* (2013.01); *H01L 21/76895* (2013.01); *H01L 21/76897* (2013.01); *H01L 27/1085* (2013.01); *H01L 27/10885* (2013.01); *H01L 27/10894* (2013.01); *H01L 27/10897* (2013.01)

(58) Field of Classification Search
None
See application file for complete search history.

(56) References Cited

U.S. PATENT DOCUMENTS

| 5,404,047 | A | 4/1995 | Rostoker et al. |
| 7,321,149 | B2 * | 1/2008 | Busch ................ H01L 21/0332 257/301 |
| 7,615,496 | B2 | 11/2009 | Lee et al. |
| 7,776,750 | B2 | 8/2010 | Kim |
| 8,012,881 | B1 | 9/2011 | Lee et al. |

(Continued)

FOREIGN PATENT DOCUMENTS

| KR | 1020080090171 | 10/2008 |
| KR | 1020100081514 | 7/2010 |
| KR | 1020110087604 | 8/2011 |

OTHER PUBLICATIONS

Definition of curved. (n. d.) American Heritage Dictionary of the English Language, Fifth Edition. (2011). Retrieved Jun. 2, 2015 from http://www.thefreedictionary.com/curved.

*Primary Examiner* — Michael Jung
(74) *Attorney, Agent, or Firm* — Myers Bigel & Sibley, P.A.

(57) ABSTRACT

An electronic device may include a substrate, and a plurality of spaced apart pads on the substrate. Each of the pads may includes first, second, third, and fourth sides, the first and third sides may be opposite sides that are substantially straight, and the second and fourth sides may be opposite sides that are curved. Related methods, devices, and structures are also discussed.

22 Claims, 51 Drawing Sheets

(56) References Cited

U.S. PATENT DOCUMENTS

| | | |
|---|---|---|
| 2004/0147114 A1 | 7/2004 | Park et al. |
| 2012/0139028 A1 | 6/2012 | Park et al. |
| 2012/0217559 A1 | 8/2012 | Kim et al. |
| 2013/0009226 A1 | 1/2013 | Park et al. |
| 2014/0117566 A1* | 5/2014 | Choi ................ H01L 27/10814 257/776 |

* cited by examiner

FIG. 21
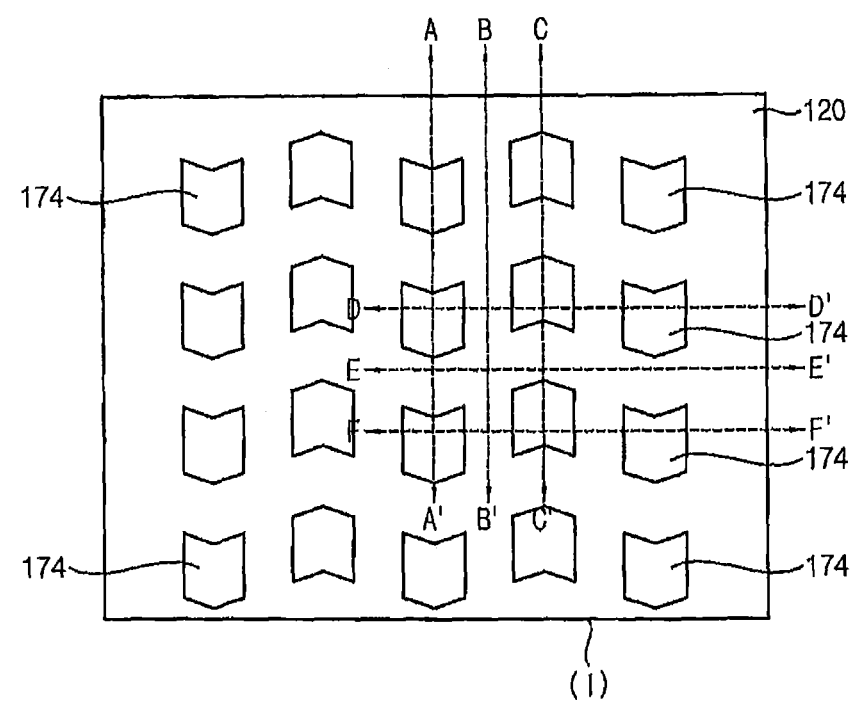
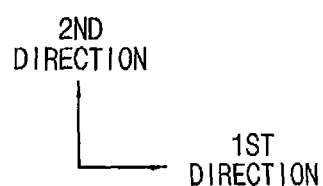

FIG. 28
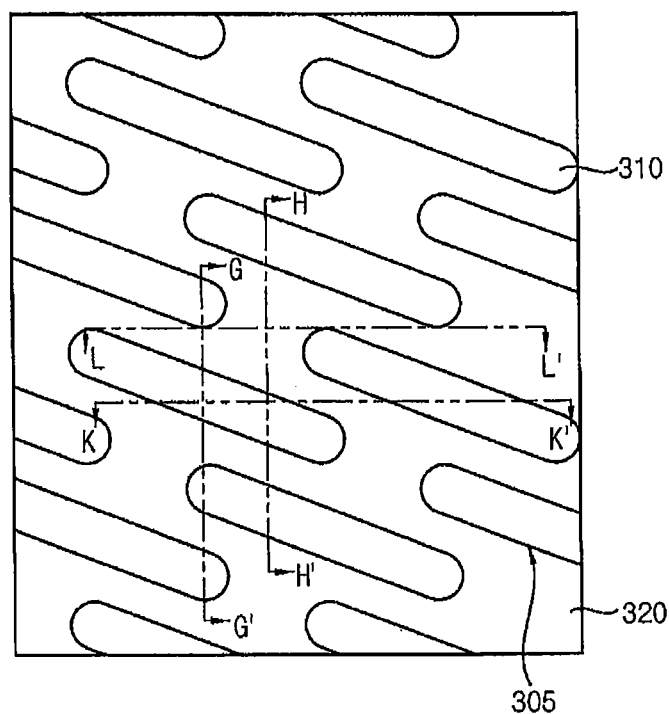
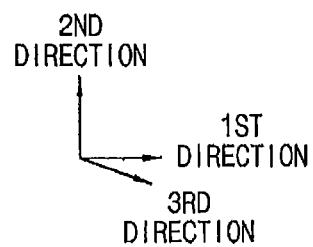

FIG. 32
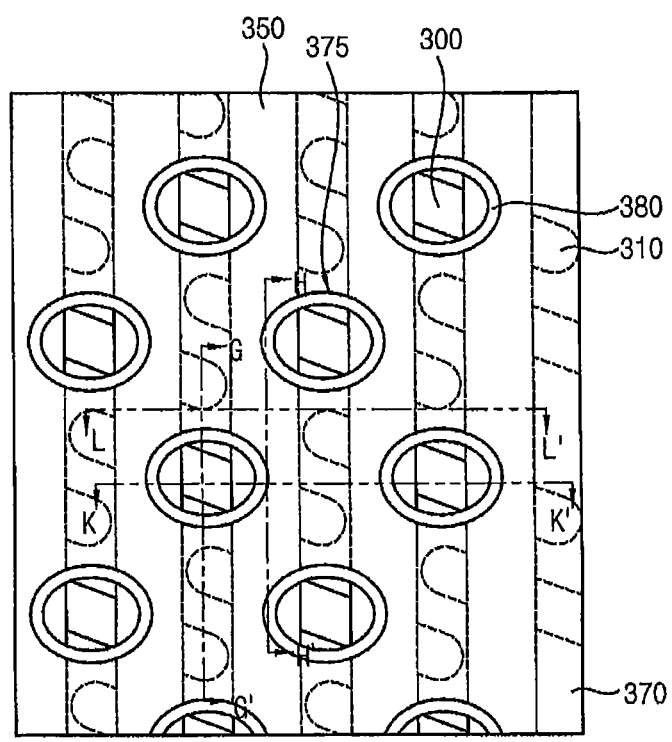
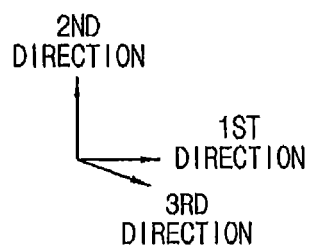

FIG. 34
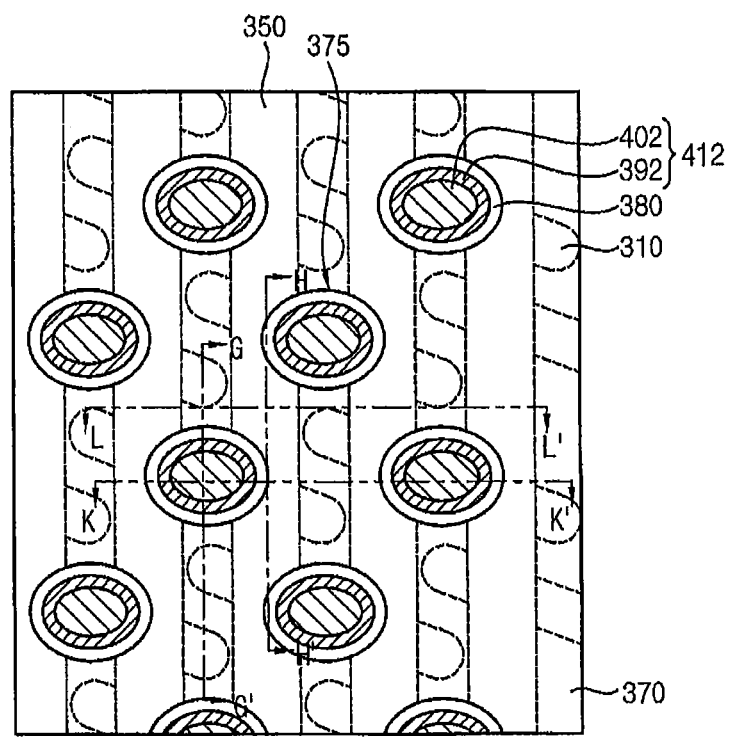
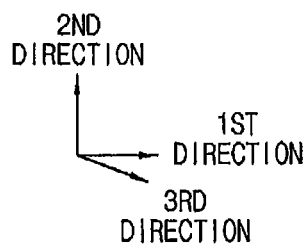

FIG. 36
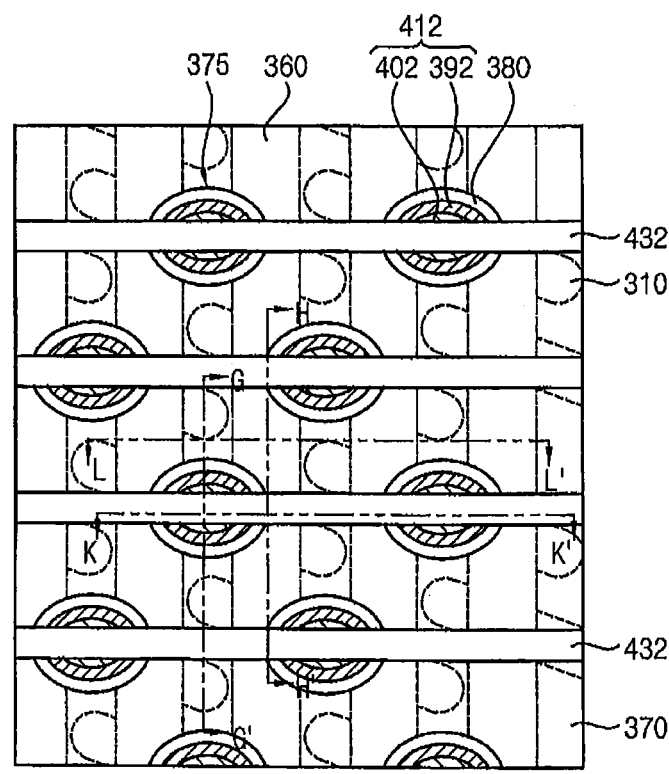
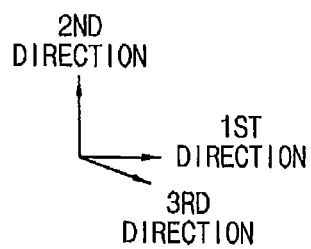

FIG. 38
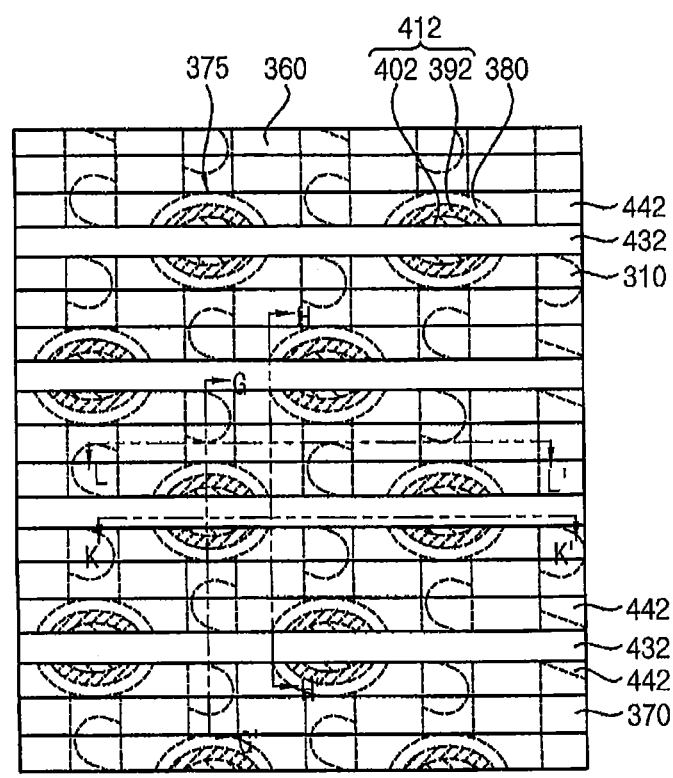
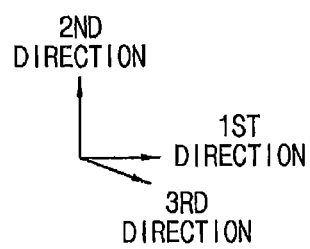

FIG. 44
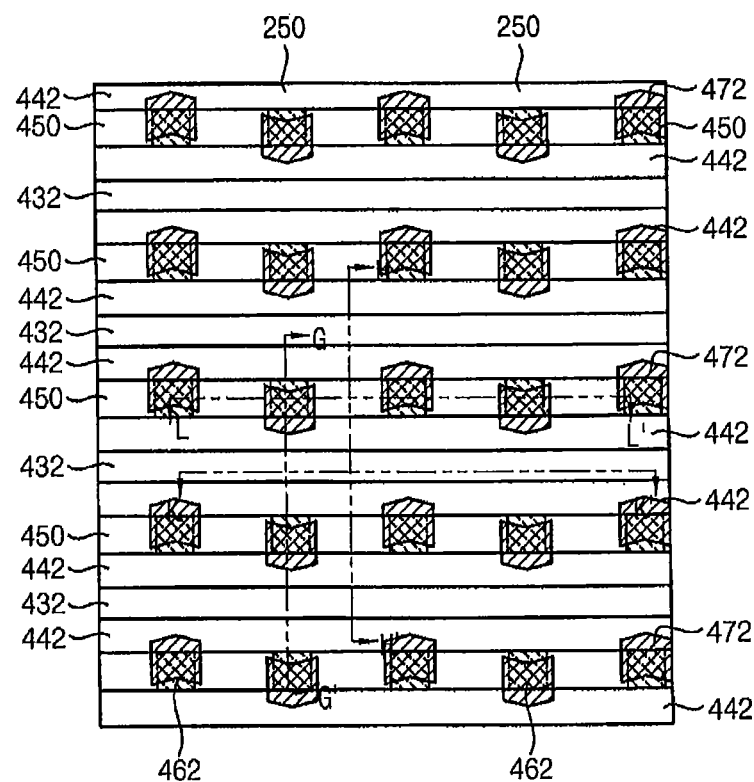
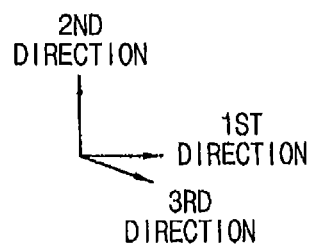

METHODS OF FORMING ELECTRONIC DEVICES HAVING PADS USING FIRST AND SECOND MASKS

CROSS-REFERENCE TO RELATED APPLICATION

This application claims the benefit of priority as a continuation of U.S. application Ser. No. 14/105,581, filed on Dec. 13, 2013, which claims priority under 35 USC §119 to Korean Patent Application No. 10-2013-0070688, filed on Jun. 20, 2013 in the Korean Intellectual Property Office (KIPO). The disclosures of both of the above referenced applications are hereby incorporated herein by reference in their entireties.

BACKGROUND

A self-align patterning method for forming patterns may include forming a first layer on a substrate, and forming a plurality of first hard mask patterns on the first layer. A sacrificial layer is formed on top surfaces and sidewalls of the first hard mask patterns, thereby forming a gap between respective facing portions of the sacrificial layer on the sidewalls of the first hard mask patterns. A second hard mask pattern is formed in the gap, the sacrificial layer is etched using the second hard mask pattern as a mask to expose the first hard mask patterns, the first layer is exposed using the exposed first hard mask patterns and the second hard mask pattern. The exposed first layer is then etched using the first and second hard mask patterns.

Such self-aligned patterning methods are discussed, for example, in U.S. Pat. No. 7,615,496 to Lee et al., entitled "Method of Forming Pad Patterns Using Self-Aligned Double Patterning Method, Pad Pattern Layout Formed Using the Same, And Method Of Forming Contact Holes Using Self-Aligned Double Patterning Method," the disclosure of which is hereby incorporated herein in its entirety by reference.

SUMMARY

According to some embodiments, a method of forming an electronic device may include providing a pad layer on a substrate, and forming a plurality of spaced apart first masks on the pad layer. Each of the first masks may define a non-linear pattern extending along a respective axis in a first direction. A plurality of spaced apart second masks may be formed on the pad layer extending in a second direction different than the first direction, wherein each of the second masks crosses each of the first masks. The pad layer may be patterned using the plurality of spaced apart first masks and the plurality of spaced apart second masks to form a plurality of spaced apart pads on the substrate.

Forming the plurality of spaced apart first masks may precede forming the plurality of spaced apart second masks. Moreover, patterning the pad layer may include patterning the plurality of spaced apart first masks using the plurality of spaced apart second masks, removing the plurality of spaced apart second masks to provide a plurality of pad masks after patterning the plurality of spaced apart first masks, patterning the pad layer using the plurality of pad masks to form the plurality of spaced apart pads, and removing the pad masks after patterning the pad layer.

Forming the plurality of spaced apart second masks may precede forming the plurality of spaced apart first masks. Moreover, patterning the pad layer may include patterning the plurality of spaced apart second masks using the plurality of spaced apart first masks, removing the plurality of spaced apart first masks to provide a plurality of pad masks after patterning the plurality of spaced apart second masks, patterning the pad layer using the plurality of pad masks to form the plurality of spaced apart pads, and removing the pad masks after patterning the pad layer.

Each of the second masks may cross the plurality of spaced apart first masks linearly.

Each of the second masks may have a non-linear pattern crossing the plurality of spaced apart first masks.

The non-linear pattern may be a periodic pattern extending along the respective axis in the first direction. Each of the second masks may cross each of the first masks at a respective maximum deviation of the first mask from the respective axis.

Forming the plurality of spaced apart first masks may include forming a first plurality of spaced apart patterns, and forming a second plurality of spaced apart patterns that are self-aligned with the first plurality of spaced apart patterns.

The substrate may include a plurality of memory cell transistors, and each of the plurality of spaced apart pads may be electrically coupled to a source/drain region of a respective one of the memory cell transistors. After forming the plurality of pads, a plurality of memory cell capacitors may be formed, wherein each of the memory cell capacitors is electrically coupled to a respective one of the pads.

The second direction may be perpendicular with respect to the first direction.

According to some other embodiments, a method of forming an electronic device may include providing a pad layer on a substrate, and forming a plurality of spaced apart first masks on the pad layer extending in a first direction. Forming the plurality of spaced apart first masks may include forming a first plurality of spaced apart patterns, and forming a second plurality of spaced apart patterns that are self-aligned with the first plurality of spaced apart patterns. A plurality of spaced apart second masks may be formed on the pad layer extending in a second direction different than the first direction, and each of the second masks may cross each of the first masks. The pad layer may be patterned using the plurality of spaced apart first masks and the plurality of spaced apart second masks to form a plurality of spaced apart pads on the substrate.

Each of the first masks may define a non-linear pattern extending along a respective axis in the first direction, and each of the second masks may define a linear pattern extending along a respective axis in the second direction.

Each of the first masks may define a linear pattern extending along a respective axis in the first direction, and each of the second masks may define a non-linear pattern extending along a respective axis in the second direction.

Each of the first masks may define a linear pattern extending along a respective axis in the first direction, and each of the second masks may define a linear pattern extending along a respective axis in the second direction.

Each of the first masks may define a non-linear pattern extending along a respective axis in the first direction, and each of the second masks may define a non-linear pattern extending along a respective axis in the second direction.

Forming the plurality of spaced apart first masks may precede forming the plurality of spaced apart second masks. In addition, patterning the pad layer may include patterning the plurality of spaced apart first masks using the plurality of spaced apart second masks, removing the plurality of spaced apart second masks to provide a plurality of pad masks after patterning the plurality of spaced apart first masks, patterning the pad layer using the plurality of pad masks to form the plurality of spaced apart pads, and removing the pad masks after patterning the pad layer.

Forming the plurality of spaced apart second masks may precede forming the plurality of spaced apart first masks. In addition, patterning the pad layer may include patterning the plurality of spaced apart second masks using the plurality of spaced apart first masks, removing the plurality of spaced apart first masks to provide a plurality of pad masks after patterning the plurality of spaced apart second masks, patterning the pad layer using the plurality of pad masks to form the plurality of spaced apart pads, and removing the pad masks after patterning the pad layer.

The substrate may include a plurality of memory cell transistors, and each of the plurality of spaced apart pads may be electrically coupled to a source/drain region of a respective one of the memory cell transistors. After forming the plurality of pads, a plurality of memory cell capacitors may be formed wherein each of the memory cell capacitors is electrically coupled to a respective one of the pads.

The second direction may be perpendicular with respect to the first direction.

Forming the plurality of spaced apart second masks may include forming a third plurality of spaced apart patterns, and forming a fourth plurality of spaced apart patterns that are self-aligned with the third plurality of spaced apart patterns.

According to some other embodiments, an electronic device may include a substrate, and a plurality of spaced apart pads on the substrate. Each of the pads may include first, second, third, and fourth sides. The first and third sides may be opposite sides that are substantially straight, and the second and fourth sides may be opposite sides that are curved.

The plurality of pads may be arranged in linear columns in a direction that is parallel with the first and third sides, and a center line connecting centers of adjacent pads of different columns may define an angle of at least 60 degrees and less than 90 degrees relative to the direction that is parallel with the first and third sides.

One of the second and fourth sides may be concave, and the other of the second and fourth sides may be convex.

Moreover, the plurality of pads may be arranged in linear columns, wherein pads of a first column may be arranged with the convex sides pointing in a first direction parallel to a direction of the columns, wherein pads of a second column may be arranged with the convex sides pointing in a second direction parallel to the direction of the columns, and wherein the first and second directions may be opposite directions.

The substrate may include a plurality of memory cell transistors, and each of the spaced apart pads may be electrically coupled to a source/drain region of a respective one of the memory cell transistors. In addition, each of a plurality of memory cell capacitors may be electrically coupled to a respective one of the pads.

According to still other embodiments, an electronic device may include a substrate, and a plurality of spaced apart pads on the substrate. Each of the pads may include first and second opposing sides wherein the first side is concave and the second side is convex.

Each of the pads may include third and fourth opposing sides extending between the first and second sides, and the third and fourth sides may be opposite sides that are substantially straight.

The plurality of pads may be arranged in linear columns in a direction that is parallel with the first and third sides, and a center line connecting centers of adjacent pads of different columns may define an angle of at least 60 degrees and less than 90 degrees relative to the direction that is parallel with the first and third sides.

The plurality of pads may be arranged in linear columns. Pads of a first column may be arranged with the convex sides pointing in a first direction parallel to a direction of the columns, pads of a second column may be arranged with the convex sides pointing in a second direction parallel to the direction of the columns, and the first and second directions may be opposite directions.

The substrate may include a plurality of memory cell transistors, and each of the spaced apart pads may be electrically coupled to a source/drain region of a respective one of the memory cell transistors. In addition, each of a plurality of memory cell capacitors may be electrically coupled to a respective one of the pads.

According to yet other embodiments, an electronic device may include a substrate, and a plurality of spaced apart pads on the substrate. The plurality of pads may be arranged in linear columns, and a center line connecting centers of adjacent pads of different columns may define an angle of at least 60 degrees and less than 90 degrees relative to a direction of the columns.

Each of the pads may include first, second, third, and fourth sides, the first and third sides may be opposite sides that are substantially straight, and the second and fourth sides may be opposite sides that are curved. Moreover, one of the second and fourth sides may be concave and the other of the second and fourth sides may be convex. Pads of a first column are arranged with the convex sides pointing in a first direction parallel to the direction of the columns, pads of a second column may be arranged with the convex sides pointing in a second direction parallel to the direction of the columns, and the first and second directions may be opposite directions.

The substrate may include a plurality of memory cell transistors, and each of the spaced apart pads may be electrically coupled to a source/drain region of a respective one of the memory cell transistors. Moreover, each of a plurality of memory cell capacitors may be electrically coupled to a respective one of the pads.

According to still more embodiments, a dynamic random access memory device may include a substrate having a plurality of memory cell transistors. Each of a plurality of spaced apart pads on the substrate may be electrically coupled to a source/drain region of a respective one of the memory cell transistors. The plurality of pads may be arranged in linear columns, and a center line connecting centers of adjacent pads of different columns may define an angle of at least 60 degrees and less than 90 degrees relative to a direction of the columns. Each of a plurality of memory cell capacitors may be electrically coupled to a respective one of the pads.

Each of the pads may include first, second, third, and fourth sides, the first and third sides may be opposite sides that are substantially straight, and the second and fourth sides may be opposite sides that are curved. One of the second and fourth sides may be concave, and the other of the second and fourth sides may be convex. Pads of a first column may be arranged with the convex sides pointing in a first direction parallel to the direction of the columns, pads of a second column may be arranged with the convex sides pointing in a second direction parallel to the direction of the columns, and the first and second directions may be opposite directions.

BRIEF DESCRIPTION OF THE DRAWINGS

Example embodiments will be more clearly understood from the following detailed description taken in conjunction with the accompanying drawings. FIGS. 1-49 represent non-limiting, example embodiments as described herein.

FIGS. 1, 4, 8, 13, 16, 18, 21 and 24 are plan views illustrating stages of forming pads in accordance with example embodiments, and FIGS. 2-3, 5-7, 9-12, 14-15, 17, 19-20 and 22-23 are related cross-sectional views illustrating stages of forming the pads in accordance with example embodiments;

FIG. 25 is a plan view illustrating a pad array in accordance with example embodiments;

FIG. 26 is a plan view illustrating a pad array in accordance with example embodiments;

FIG. 27 is a plan view illustrating a pad array in accordance with example embodiments;

FIGS. 28, 30, 32, 34, 36, 38, 40, 43 and 44 are related plan views illustrating stages of a method of manufacturing a semiconductor device in accordance with example embodiments, and FIGS. 29, 31, 33, 35, 37, 39, 41, 42, 45 and 46 are cross-sectional views illustrating stages of a method of manufacturing the semiconductor device in accordance with example embodiments;

FIG. 47 is a plan view illustrating the locations of second contact plugs, landing pads and lower electrodes in the semiconductor device of FIG. 46;

FIG. 48 is a plan view illustrating locations of second contact plugs, landing pads and lower electrodes in the semiconductor device in accordance with other example embodiments;

FIG. 49 is a cross-sectional view of the semiconductor device in FIG. 48.

DETAILED DESCRIPTION

Figure 1:
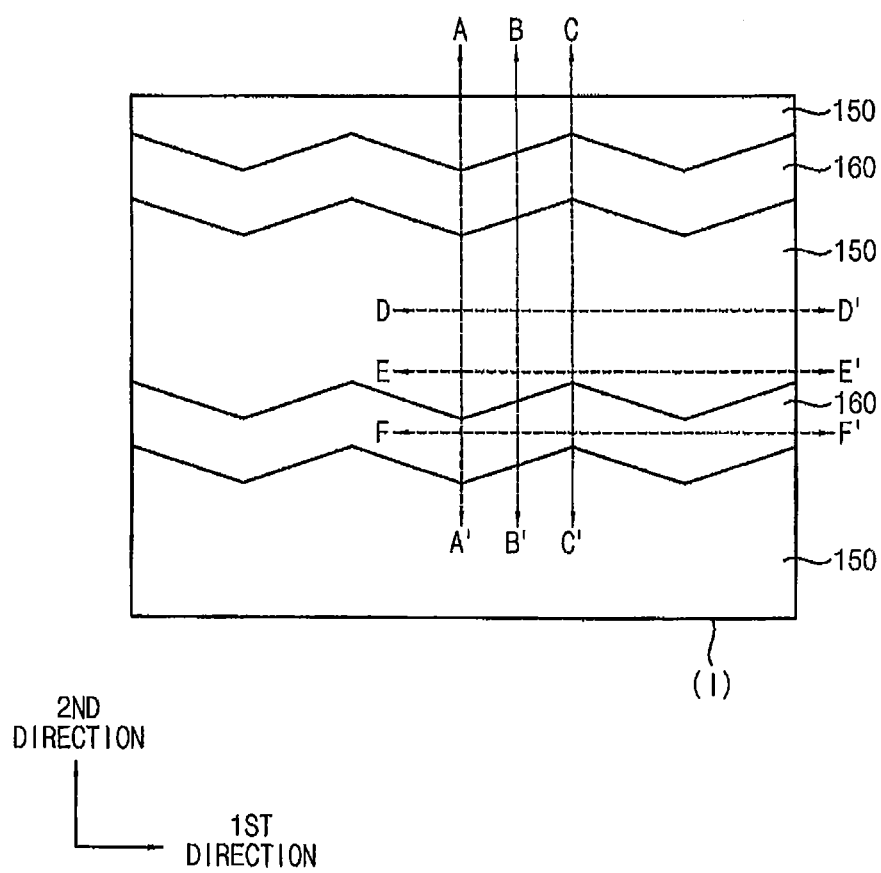

Example embodiments will now be described more fully with reference to the accompanying drawings, in which example embodiments are shown. Example embodiments may, however, be embodied in many different forms and should not be construed as limited to the example embodiments set forth herein. In the drawings, the thicknesses of layers and regions are exaggerated for clarity. Like reference numerals in the drawings denote like elements, and thus their repeated description may be omitted and/or abbreviated.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms first, second, third, etc. may be used herein to describe various elements, components, regions, layers and/or sections, these elements, components, regions, layers and/or sections should not be limited by these terms. Unless indicated otherwise, these terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1, 4, 8, 13, 16, 18, 21 and 24 are plan views illustrating stages of forming pads on substrate 99 in accordance with example embodiments, and FIGS. 2-3, 5-7, 9-12, 14-15, 17, 19-20 and 22-23 are related cross-sectional views illustrating stages of forming the pads in accordance with example embodiments.

Each of the cross-sectional views includes cross-sections of the corresponding plan view cut along lines A-A', B-B', C-C', D-D', E-E' and F-F', respectively. The lines A-A', B-B' and C-C' extend in a second direction substantially parallel to a top surface of an etching object layer, and the lines D-D', E-E' and F-F' extend in a first direction substantially parallel to the top surface of the etching object layer and substantially perpendicular to the second direction.

The method of forming the pads may be performed together with a method of forming wirings. That is, the pads may be formed in a first region I according to the method of forming the pads, and simultaneously the wirings may be formed in a second region II according to the method of forming the wirings. Thus, a portion of each cross-sectional view labeled II also illustrates a cross-section of the second region II cut along the second direction (not shown in FIG. 1 or in any of the other plan views).

Figure 2:
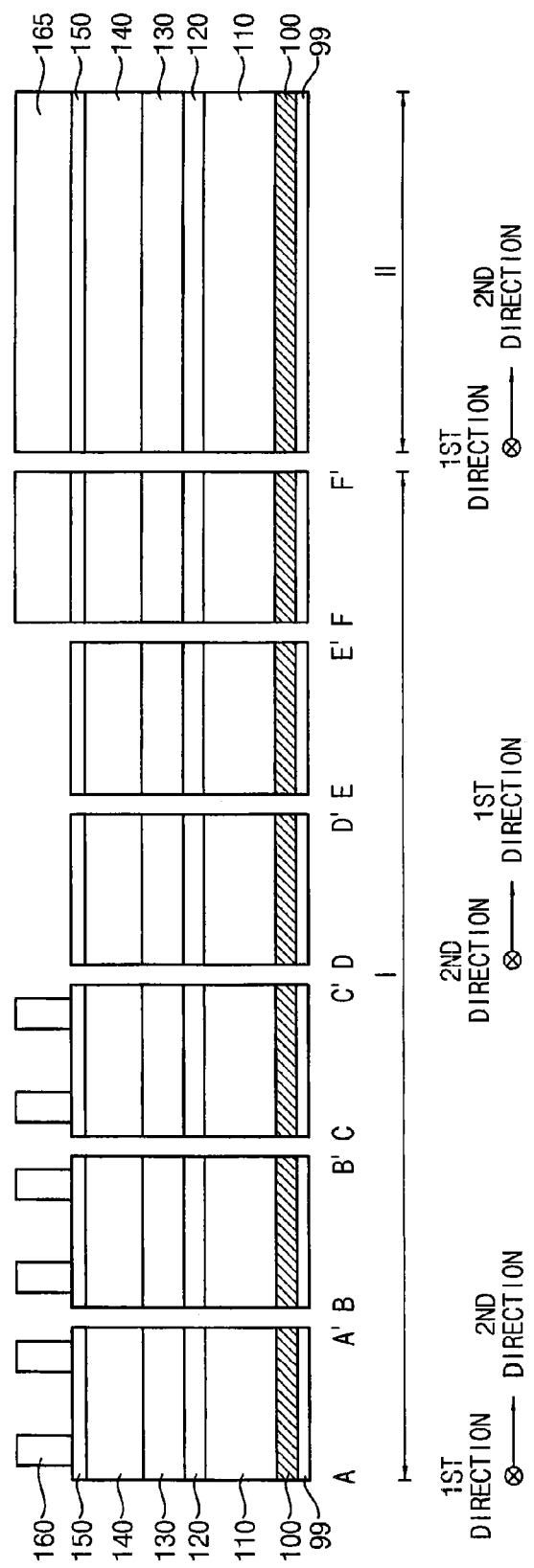

Referring to FIGS. 1 and 2, a first layer 110, a second layer 120, a first mask layer 130, a third layer 140 and a fourth layer 150 may be sequentially formed on an etching object layer 100 (also referred to as a pad layer), and first and third photoresist patterns 160 and 165 may be formed on the fourth layer 150 in the first and second regions I and II, respectively.

The etching object layer 100 may include various types of layers that may be patterned to be transformed into patterns, e.g., pads, wirings, masks, etc. Thus, the etching object layer 100 may be referred to as a pad layer, a wiring layer, a mask layer, etc., in accordance with the desired patterns. The etching object layer 100 may include a conductive material or an insulating material. Examples of the conductive material may include a metal, (e.g., tungsten, titanium, tantalum, etc.), a metal nitride, a metal silicide, a doped polysilicon, etc., and examples of the insulating material may include silicon nitride, silicon oxide, silicide oxynitride, etc.

For example, the first layer 110 may be an amorphous carbon layer (ACL), the second and fourth layers 120 and 150 may include an oxynitride, e.g., plasma enhanced silicon oxynitride (PE-SION), the first mask layer 130 may include an oxide, e.g., atomic layer deposition oxide (ALD-OX), and the third layer 140 may include spin-on-hardmask In example embodiments, the first photoresist pattern 160 may extend in the first direction, and a plurality of first photoresist patterns 160 may be formed in the second direction. Each of the first photoresist patterns 160 may extend in a non-linear pattern (also referred to as a waveform) along an axis in the first direction. That is, each first photoresist pattern 160 may not extend in a straight line in the first direction but may fluctuate right and left as it extends along an axis in the first direction, and thus may have an amplitude along the second direction. The third photoresist pattern 165 may entirely cover the second region II.

An anti-reflective coating (ARC) layer (not shown) may be further formed between the fourth layer 150 and the first photoresist pattern 160 and/or between the fourth layer 150 and the third photoresist pattern 165.

Figure 3:
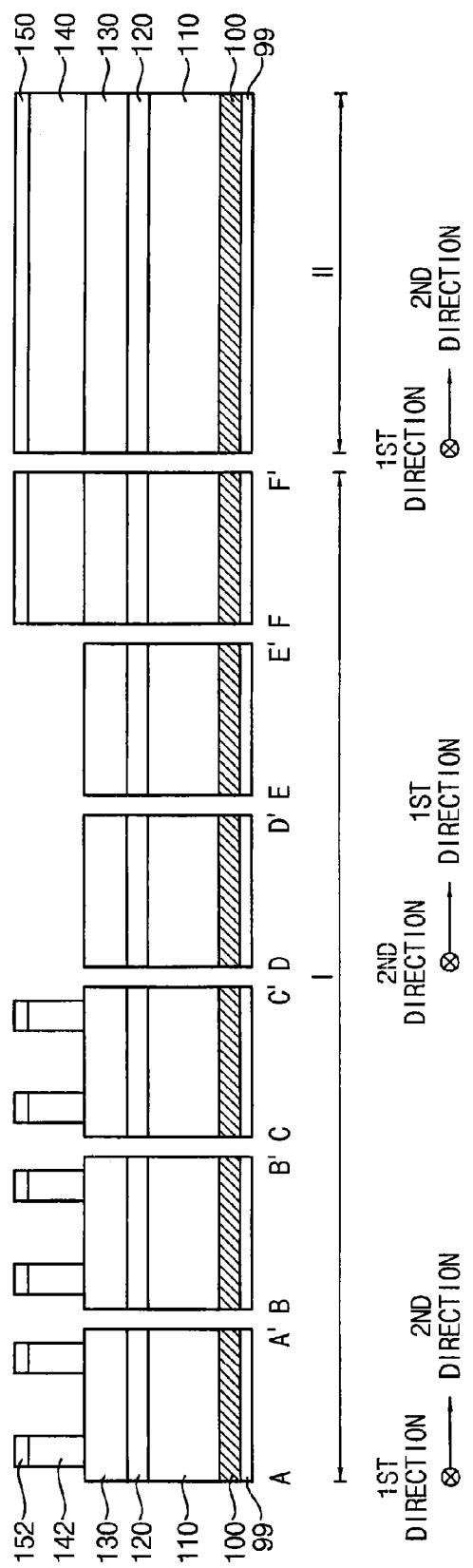

Referring to FIG. 3, in the first region I, the fourth and third layers 150 and 140 may be sequentially etched using the first photoresist pattern 160 as an etching mask to form fourth and third layer patterns 152 and 142, respectively, and a top surface of the first mask layer 130 may be exposed. In example embodiments, a plurality of third layer patterns 142 and a plurality of fourth layer patterns 152 may be formed in the second direction. Hereinafter, one of the third layer patterns 142 and one of the fourth layer patterns 152 thereon may be referred to as simply as a first pattern 142 and 152. Each first pattern 142 and 152, like the first photoresist pattern 160, may extend in a waveform along the first direction, and a plurality of first patterns 142 and 152 may be formed in the second direction. In the second region II, the third photoresist pattern 165 entirely covers the fourth layer 150, and thus the fourth layer 150 may not be etched in the second region II.

The first and third photoresist patterns 160 and 165 may be removed. In example embodiments, the first and third photoresist patterns 160 and 165 may be removed using an ashing process and/or a stripping process.

Figure 4:
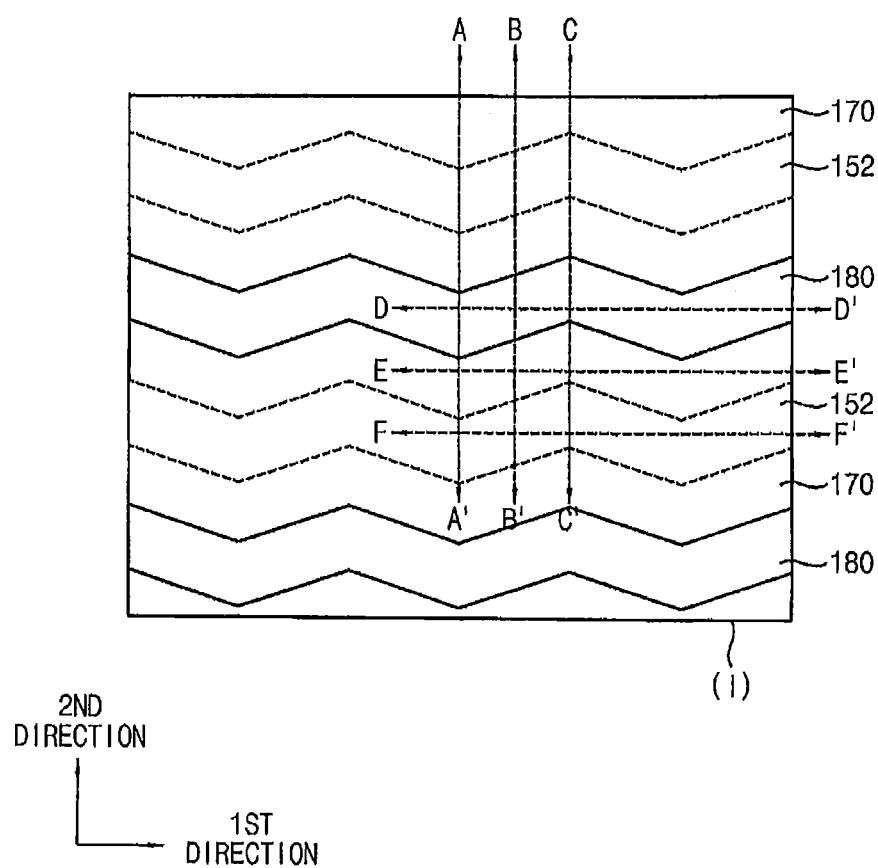
Figure 5:
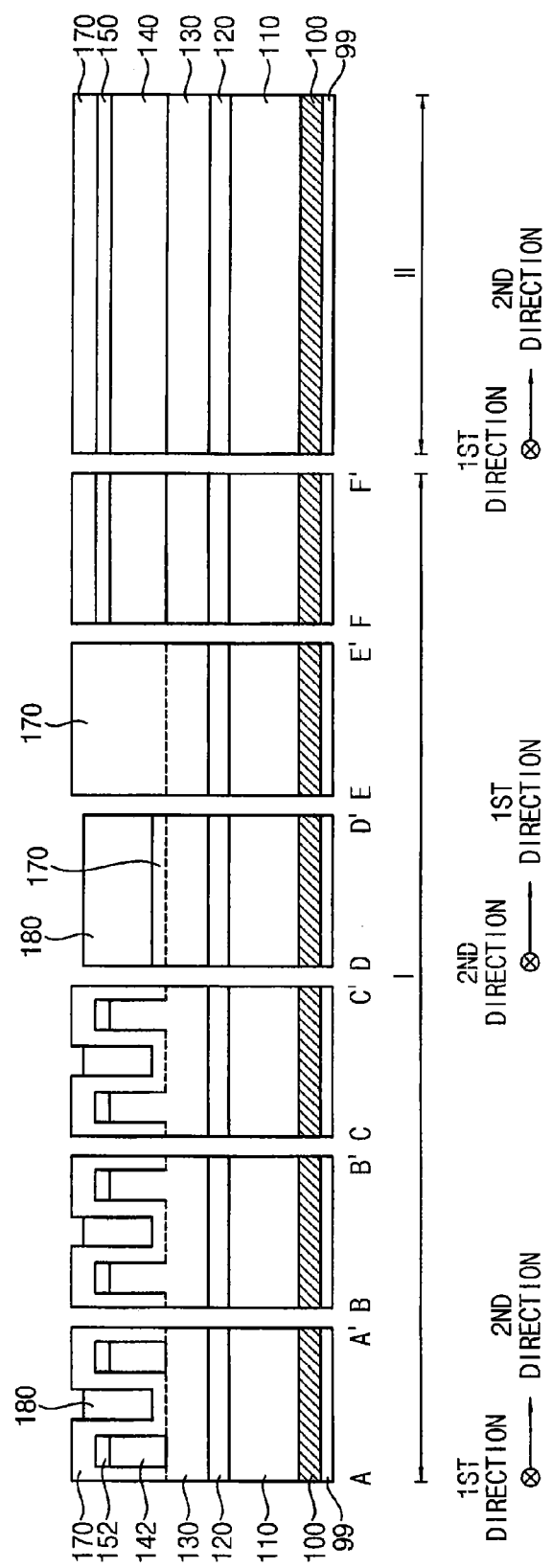

Referring to FIGS. 4 and 5, a second mask layer 170 may be formed on the plurality of first patterns 142 and 152 and the exposed top surface of the first mask layer 130 in the first region I, and on the fourth layer 150 in the second region II. A second pattern 180 may be formed on a portion of the second mask layer 170 between the plurality of first patterns 142 and 152.

In example embodiments, the second mask layer 170 may be conformally formed on sidewalls and top surfaces of the first patterns 142 and 152, on the exposed top surface of the first mask layer 130, and on the fourth layer 150. In example embodiments, the second mask layer 170 may be formed to include a material substantially the same as that of the first mask layer 130, e.g., ALD-OX. Thus, the first and second mask layers 130 and 170 in the first region I may be merged into a layer, and the merged layer will be shown as a single layer in figures after FIG. 5.

In example embodiments, the second pattern 180 may be formed by forming a filling layer on the second mask layer 170 to sufficiently fill a space between the plurality of first patterns 142 and 152 and planarizing an upper portion of the filling layer. The filling layer may be formed to include a material substantially the same as that of the third layer 140, and thus may include, e.g., SOH (spin-on-hardmask). The planarization process may be performed by an etch back process and/or a chemical mechanical polishing (CMP) process. The second pattern 180 may have a top surface substantially coplanar with or lower than an uppermost portion of the top surface of the second mask layer 170.

The second mask layer 170 may be conformally formed on the sidewalls and the top surfaces of the first patterns 142 and 152, the exposed top surface of the first mask layer 130 and the fourth layer 150, and thus the second pattern 180 formed on the portion of the second mask layer 170 between the plurality of first patterns 142 and 152 in the first region I may have a shape substantially the same as or similar to that of each first pattern 142 and 152. In an example embodiment, the second pattern 180 may be formed to have a width along the second direction substantially the same as that of each first pattern 142 and 152 along the second direction.

Figure 6:
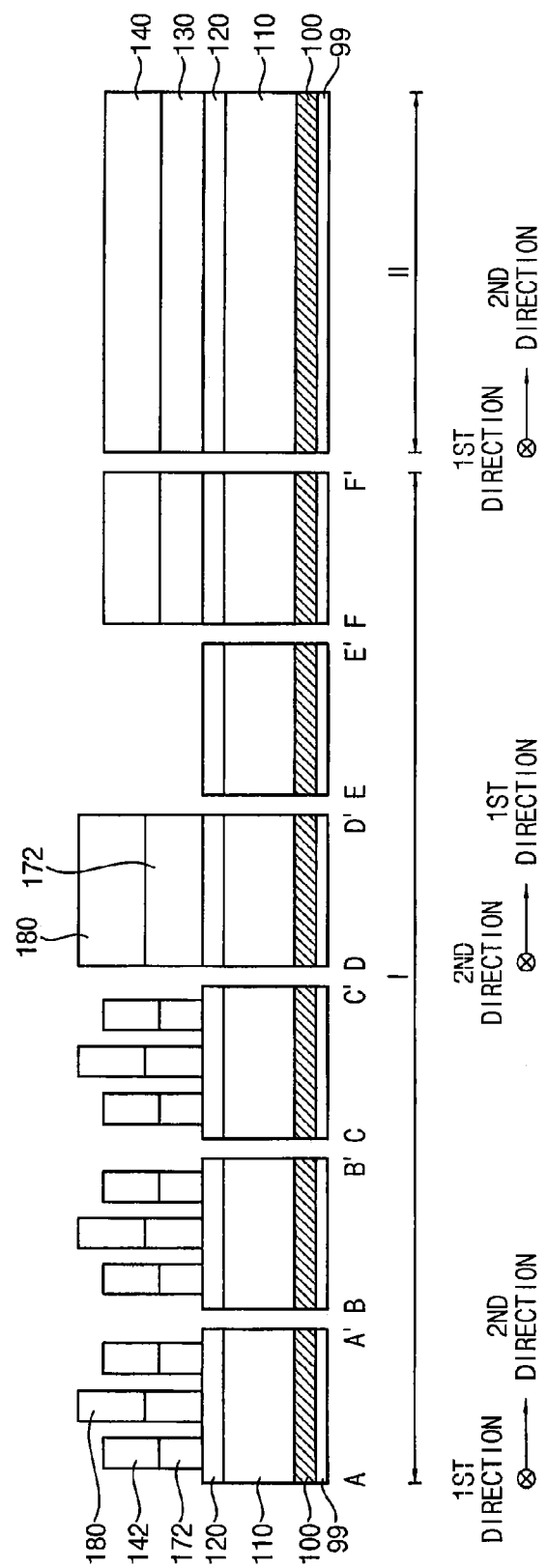

Referring to FIG. 6, the merged first and second mask layers 130 and 170 in the first region I and the second mask layer 170 in the second region II may be etched using the first patterns 142 and 152 and the second patterns 180 as an etching mask to form first masks 172 in the first region I and to remove the second mask layer 170 from the second region II. In the etching process, the fourth layer pattern 152 of the first pattern 142 and 152 may be removed from the first region I, and the fourth layer 150 may be removed from the second region II.

Thus, in the first region I, a plurality of first structures each of which may include the first mask 172 and the third layer pattern 142 sequentially stacked on the second layer 120, and a plurality of second structures each of which may include the first mask 172 and the second pattern 180 sequentially stacked on the second layer 120 may be formed. Each of the first structures and each of the second structures, like the first pattern 142 and 152 and the second pattern 180, may extend in a non-linear pattern (also referred to as a waveform) along an axis in the first direction. In the second region II, the first mask layer 130 and the third layer 140 that are sequentially stacked on the second layer 120 may remain.

Figure 7:
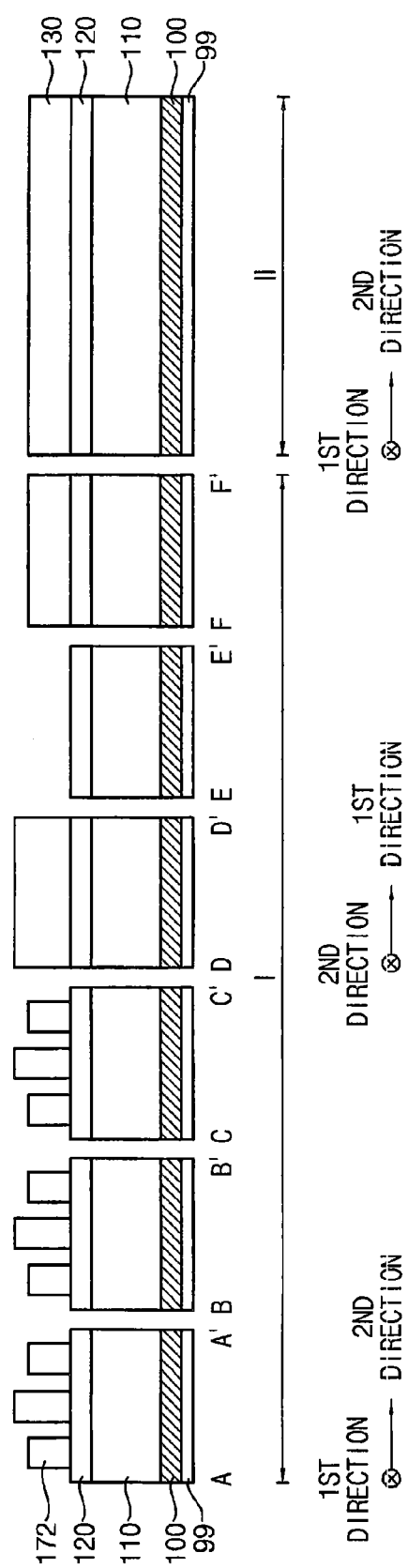

Referring to FIG. 7, the third layer patterns 142 and the second patterns 180 may be removed from the first region I to expose the first masks 172, and the third layer 140 may be removed from the second region II to expose the first mask layer 130. Each of the exposed first masks 172 in the first region I may extend in a non-linear pattern (also referred to as a waveform) along the first direction, and the exposed first mask layer 130 in the second region II may entirely cover the second layer 120. In example embodiments, the third layer patterns 142, the second patterns 180, and the third layer 140 may be removed using an ashing process and/or a stripping process.

Figure 8:
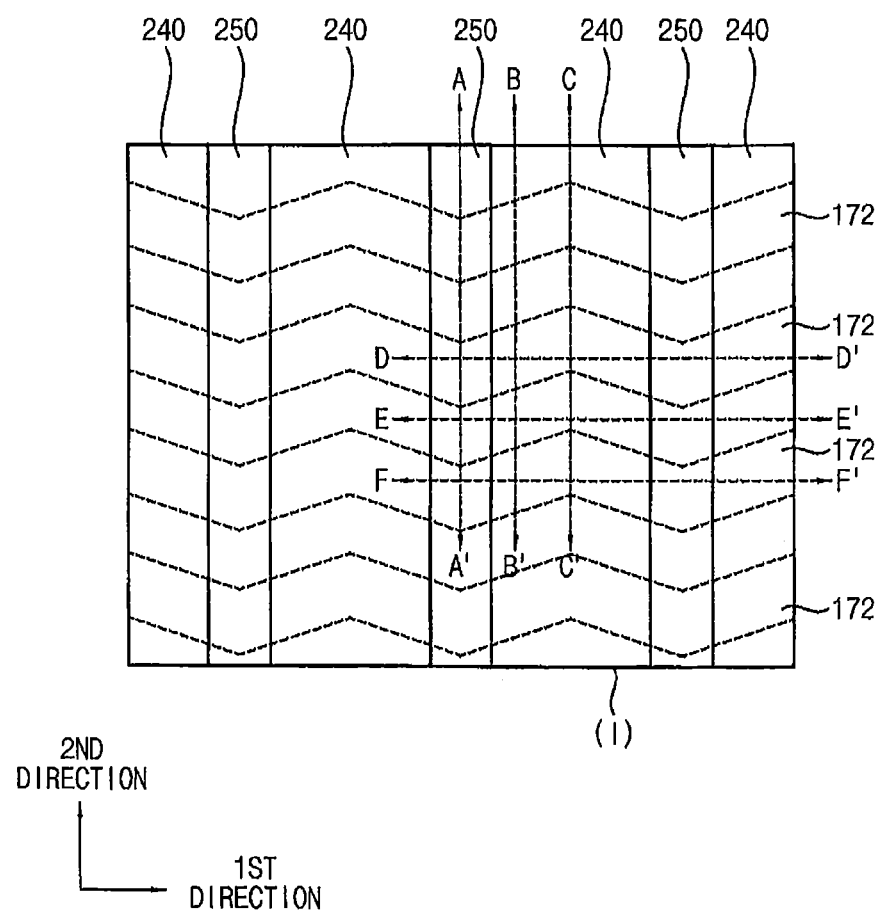
Figure 9:
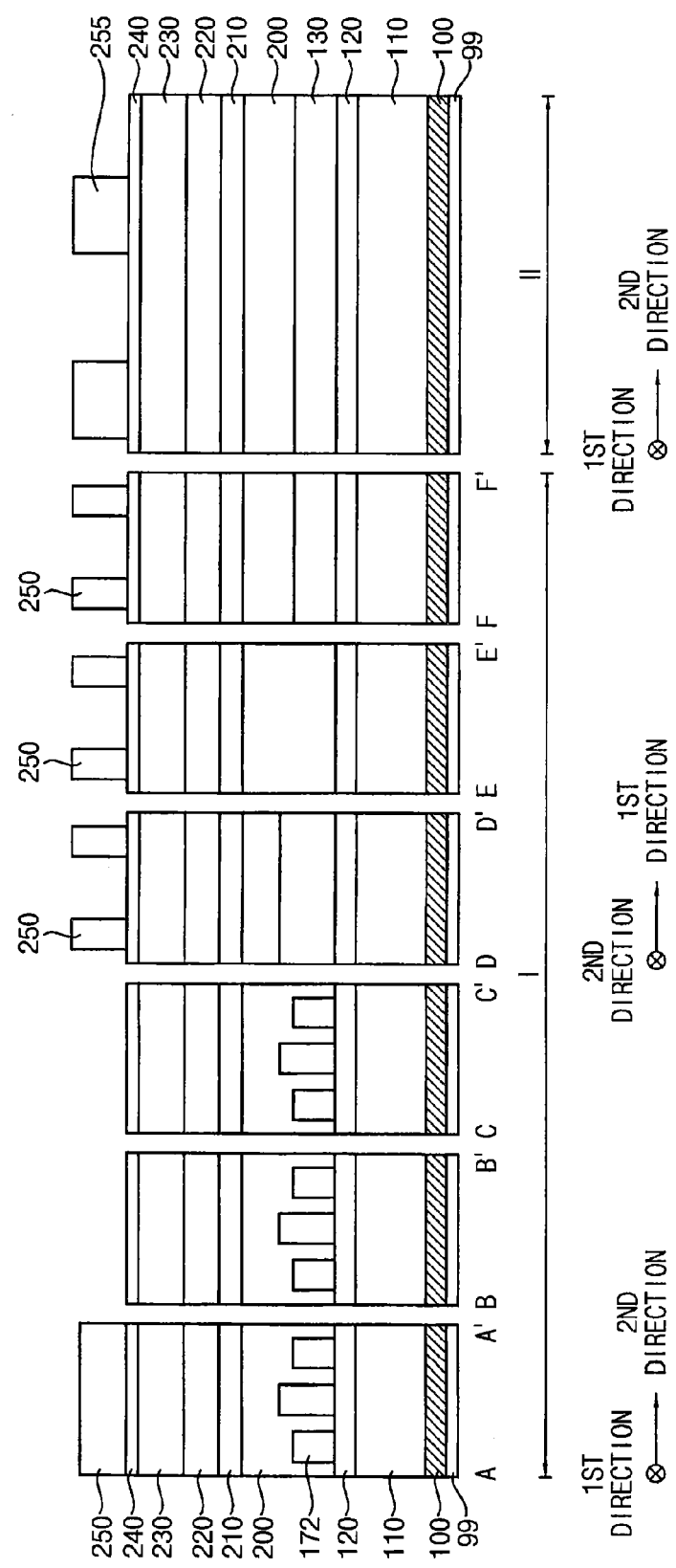

Referring to FIGS. 8 and 9, in the first region I, a first planarization layer 200 may be formed on the second layer 120 to sufficiently cover the first masks 172, and in the second region II, the first planarization layer 200 may be formed on the first mask layer 130. A fifth layer 210, a third mask layer 220, a sixth layer 230 and a seventh layer 240 may be sequentially formed on the first planarization layer 130 both in the first and second regions I and II. Second and fourth photoresist patterns 250 and 255 may be formed on the seventh layer 240 in the first and second regions I and II, respectively.

The first planarization layer 200 may be formed to include a material substantially the same as that of the third layer 140, and thus may include, e.g., SOH. The fifth and seventh layers 210 and 240 may be formed to include a material substantially the same as that of the second and fourth layers 120 and 150, and thus may include an oxynitride, e.g., PE-SiON. The third mask layer 220 may be formed to include a material substantially the same as that of the first and second mask layers 130 and 170, and thus may include an oxide, e.g., ALD-OX. The sixth layer 230 may be formed to include a material substantially the same as that of the third layer 140 and the first planarization layer 200, and thus may include, e.g., SOH.

In example embodiments, the second photoresist pattern 250 may extend in the second direction, and a plurality of second photoresist patterns 250 may be formed in the first direction. Each of the second photoresist patterns 250 may extend in a straight line in the second direction. In example embodiments, the second photoresist patterns 250 may be spaced apart from each other in the first direction at a distance of about 2 times to about 4 times of a width of each second photoresist pattern 250 in the first direction. The fourth photoresist pattern 255 may have various shapes according to the desired shape of the wirings, and e.g., may extend in the first direction.

An ARC layer (not shown) may be further formed between the seventh layer 240 and the second photoresist pattern 250 and/or between the seventh layer 240 and the fourth photoresist pattern 255.

Figure 10:
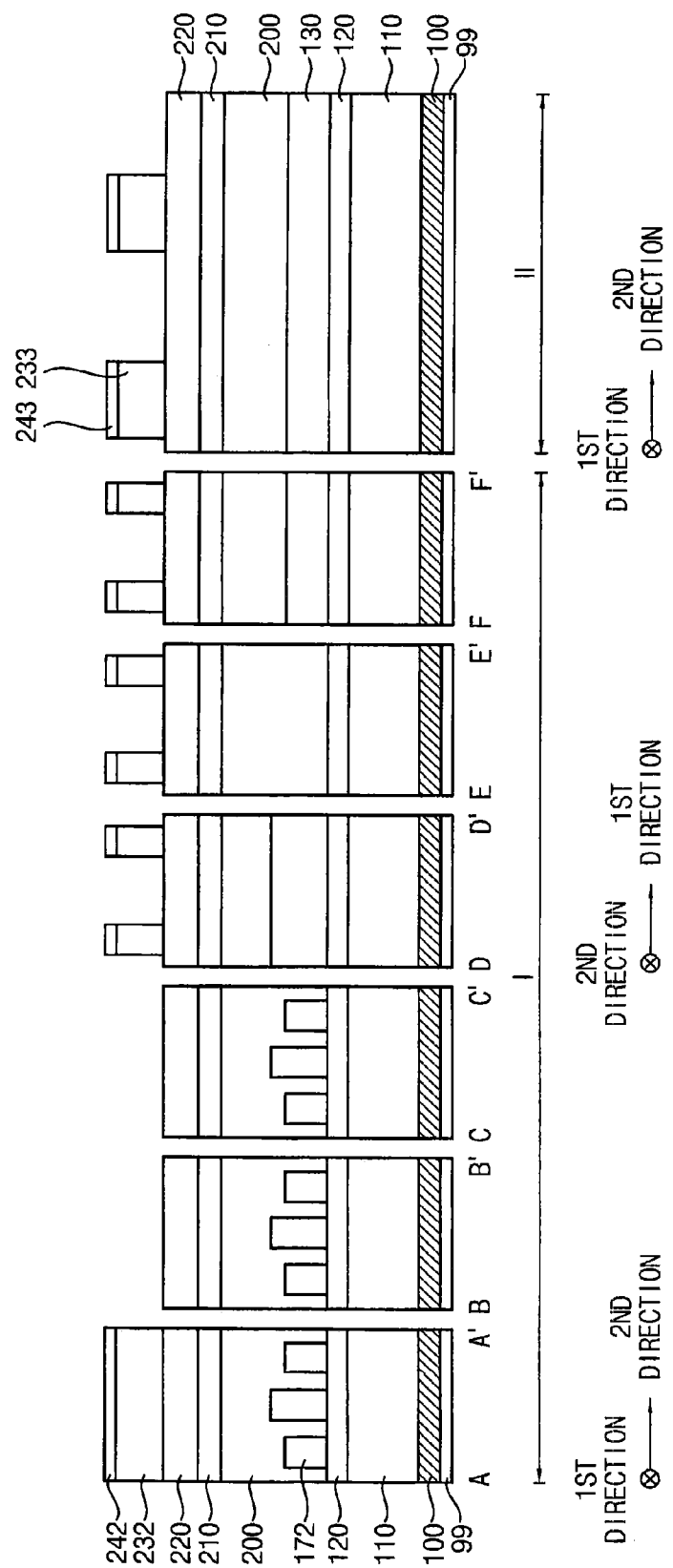

Referring to FIG. 10, a process substantially the same as or similar to that discussed with reference to FIG. 3 may be performed.

Thus, in the first region I, the seventh and sixth layers 240 and 230 may be sequentially etched using the second photoresist pattern 250 as an etching mask to form seventh and sixth layer patterns 242 and 232, respectively, and a top surface of the third mask layer 220 may be exposed. In example embodiments, a plurality of sixth layer patterns 232 and a plurality of seventh layer patterns 242 may be formed in the first direction. Hereinafter, one of the sixth layer patterns 232 and one of the seventh layer patterns 242 thereon may be referred to simply as a third pattern 232 and 242. Each third pattern 232 and 242, like the second photoresist pattern 250, may extend in a straight line in the second direction, and a plurality of third patterns 232 and 242 may be formed in the first direction.

In the second region II, the seventh and sixth layers 240 and 230 may be sequentially etched using the fourth photoresist pattern 255 as an etching mask to form ninth and eighth layer patterns 243 and 233, respectively, and a top surface of the third mask layer 220 may be exposed. Hereinafter, the eighth and ninth layer patterns 233 and 243 may be referred to simply as a fifth pattern 233 and 243.

The second and fourth photoresist patterns 250 and 255 may be removed.

Figure 11:
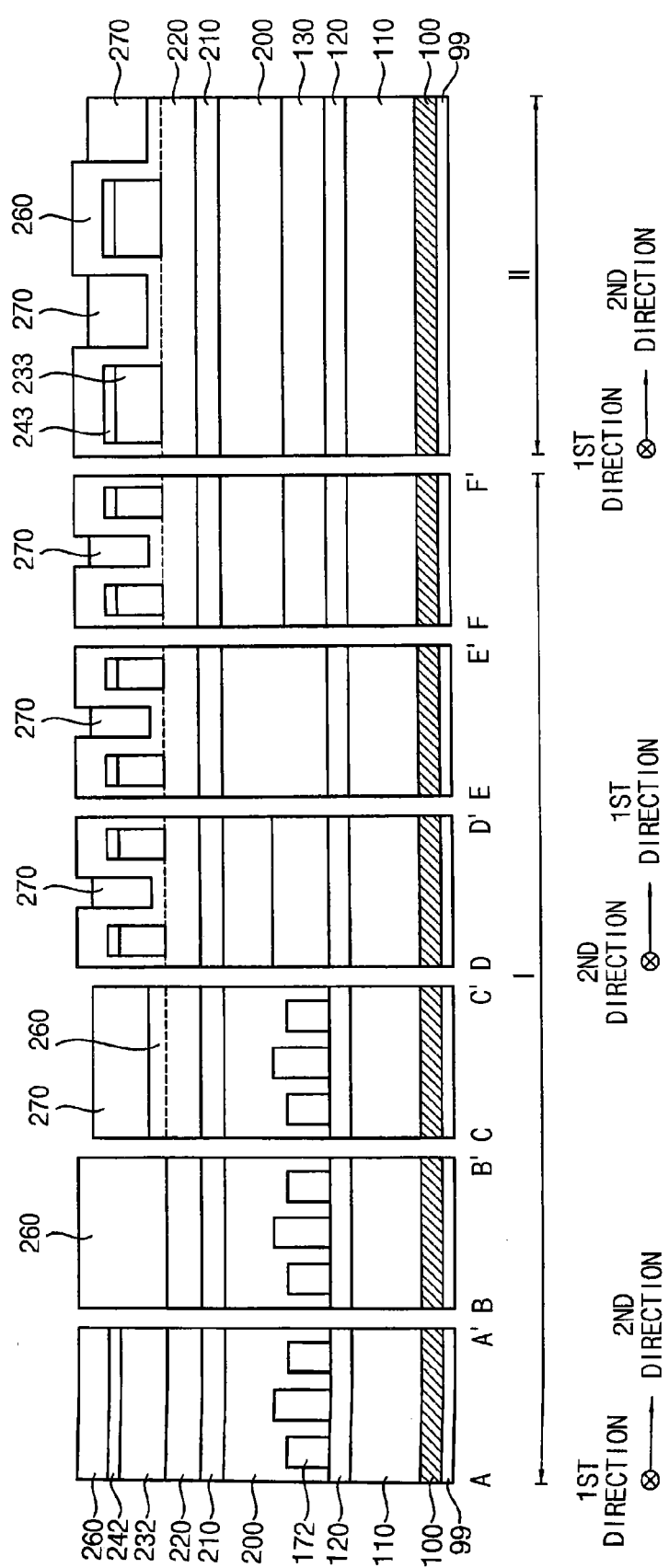

Referring to FIG. 11, a process substantially the same as or similar to that illustrated with reference to FIGS. 4 and 5 may be performed.

Thus, in the first region I, a fourth mask layer 260 may be formed on the plurality of third patterns 232 and 242 and the exposed top surface of the third mask layer 220, and a fourth pattern 270 may be formed on a portion of the fourth mask layer 260 between the plurality of third patterns 232 and 242. In the second region II, the fourth mask layer 260 may be formed on the plurality of fifth patterns 233 and 243 and the exposed top surface of the third mask layer 220, and the fourth pattern 270 may be formed on a portion of the fourth mask layer 260 between the plurality of fifth patterns 233 and 243.

In example embodiments, the fourth mask layer 260 may be conformally formed on sidewalls and top surfaces of the third patterns 232 and 242, sidewalls and top surfaces of the fifth patterns 233 and 243, and the exposed top surface of the third mask layer 220. In example embodiments, the fourth mask layer 260 may be formed to include a material substantially the same as that of the third mask layer 220, e.g., ALD-OX. Thus, the third and fourth mask layers 220 and 260 may be merged into a layer, and the merged layer will be shown as a single layer in figures after FIG. 12.

The fourth pattern 270 may be formed to include a material substantially the same as that of the sixth and eighth layer patterns 232 and 233, and thus may include, e.g., SOH. The fourth pattern 270 may have a top surface substantially coplanar with or lower than an uppermost portion of the top surface of the fourth mask layer 260. The fourth pattern 270 may have a shape substantially the same as or similar to that of each third pattern 232 and 242 in the first region I, and may have a shape substantially the same as or similar to that of each fifth pattern 233 and 243 in the second region II. In an example embodiment, the fourth pattern 270 may be formed to have a width along the first direction substantially the same as that of each third pattern 232 and 242 along the first direction in the first region I.

Figure 12:
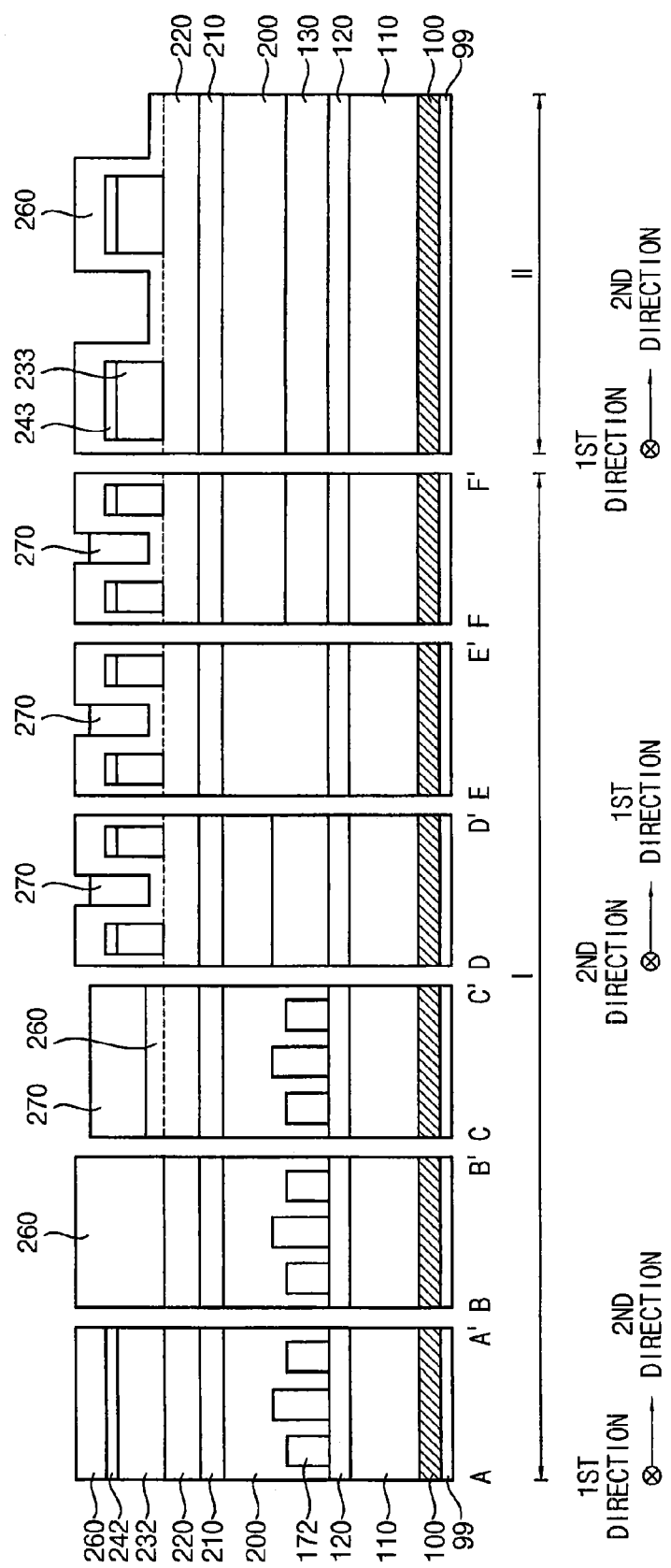

Referring to FIG. 12, a portion of the fourth pattern 270 formed in the second region II may be removed. In example embodiments, after forming a mask (not shown) covering the first region I, an ashing process and/or a stripping process may be performed to remove the portion of the fourth pattern 270 in the second region II.

Figure 13:
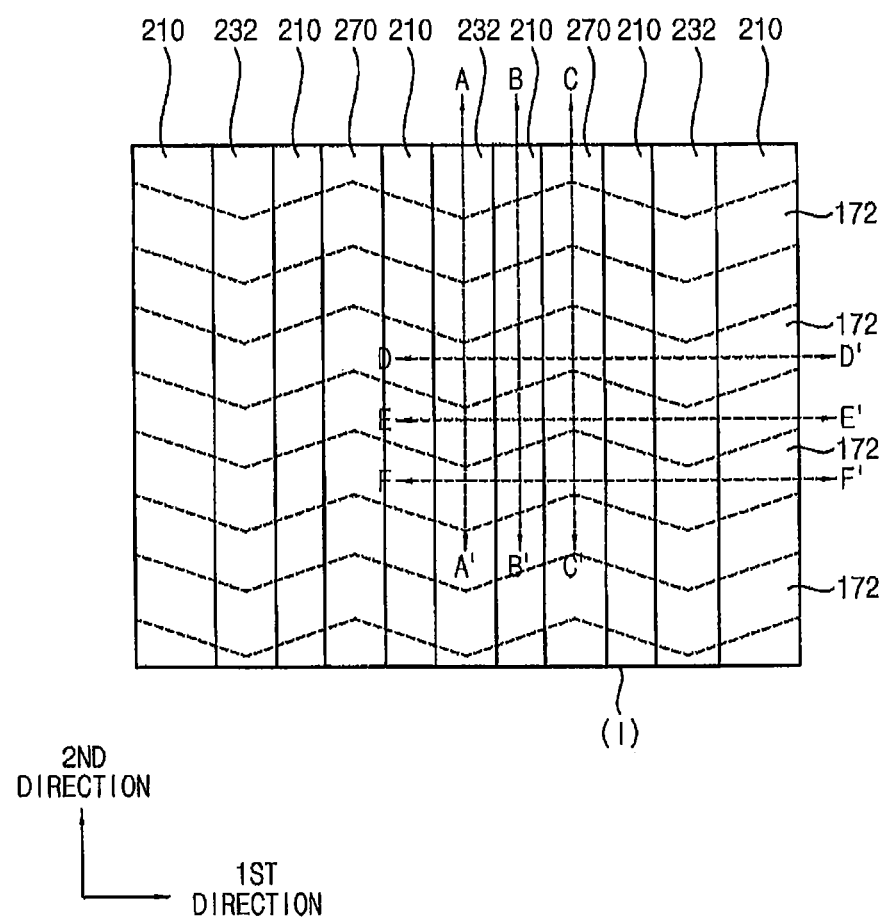
Figure 14:
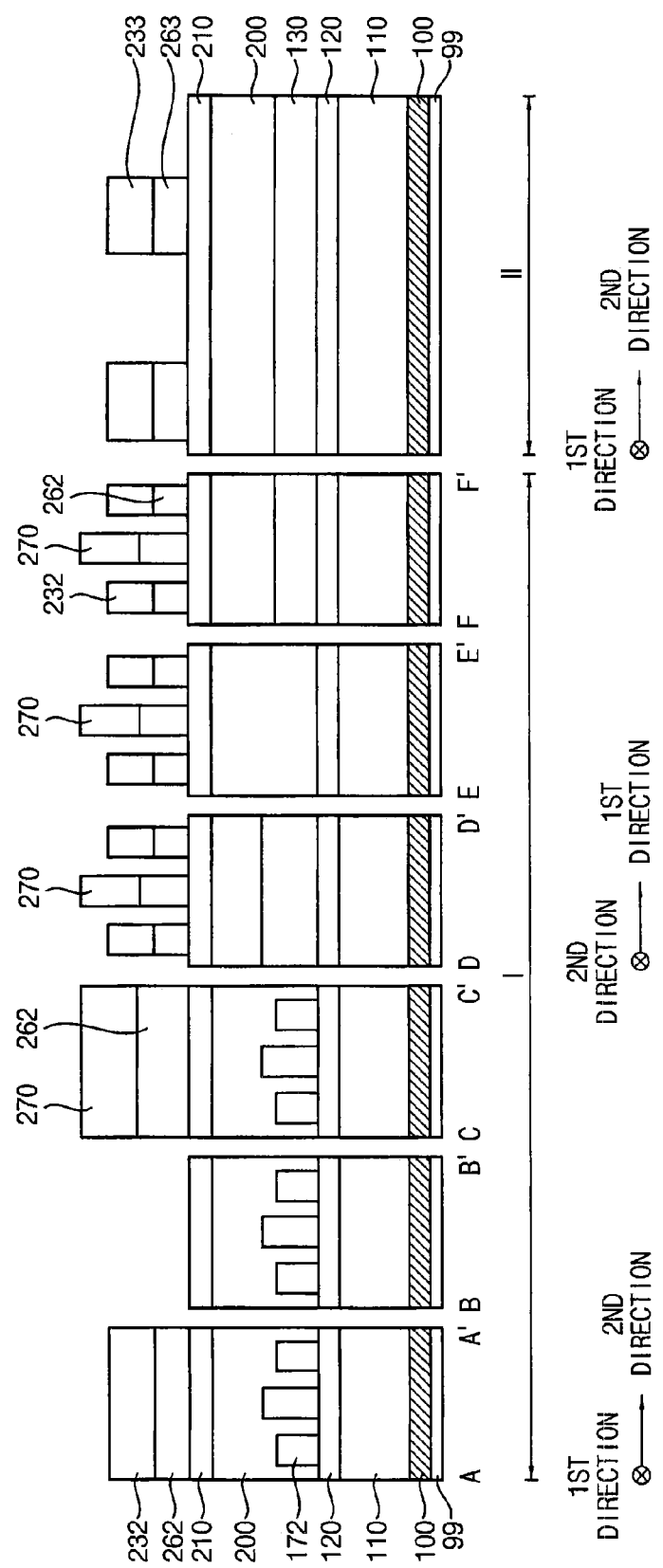

Referring to FIGS. 13 and 14, a process substantially the same as or similar to that illustrated with reference to FIG. 6 may be performed.

Thus, in the first region I, the merged third and fourth mask layers 220 and 260 may be etched using the third patterns 232 and 242 and the fourth patterns 270 as an etching mask to form second masks 262. In the etching process, the seventh layer pattern 242 of the third pattern 232 and 242 may be removed from the first region I. In the second region II, the merged third and fourth mask layers 220 and 260 may be etched using the fifth patterns 233 and 243 as an etching mask to form fourth masks 263. In the etching process, the ninth layer pattern 243 of the fifth pattern 233 and 243 may be removed from the second region II.

Thus, in the first region I, a plurality of third structures (each of which may include the second mask 262 and the sixth layer pattern 232 sequentially stacked on the fifth layer 210), and a plurality of fourth structures (each of which may include the second mask 262 and the fourth pattern 270 sequentially stacked on the fifth layer 210) may be formed. Each of the third structures and each of the fourth structures, like the third pattern 232 and 242 and the fourth pattern 270, may extend in a straight line in the second direction. In the second region II, a plurality of fifth structures (each of which may include the fourth mask 263 and the eighth layer pattern 233 sequentially stacked on the fifth layer 210) may be formed. Each of the fifth structures may have a shape substantially the same as that of each fifth pattern 233 and 243.

Figure 15:
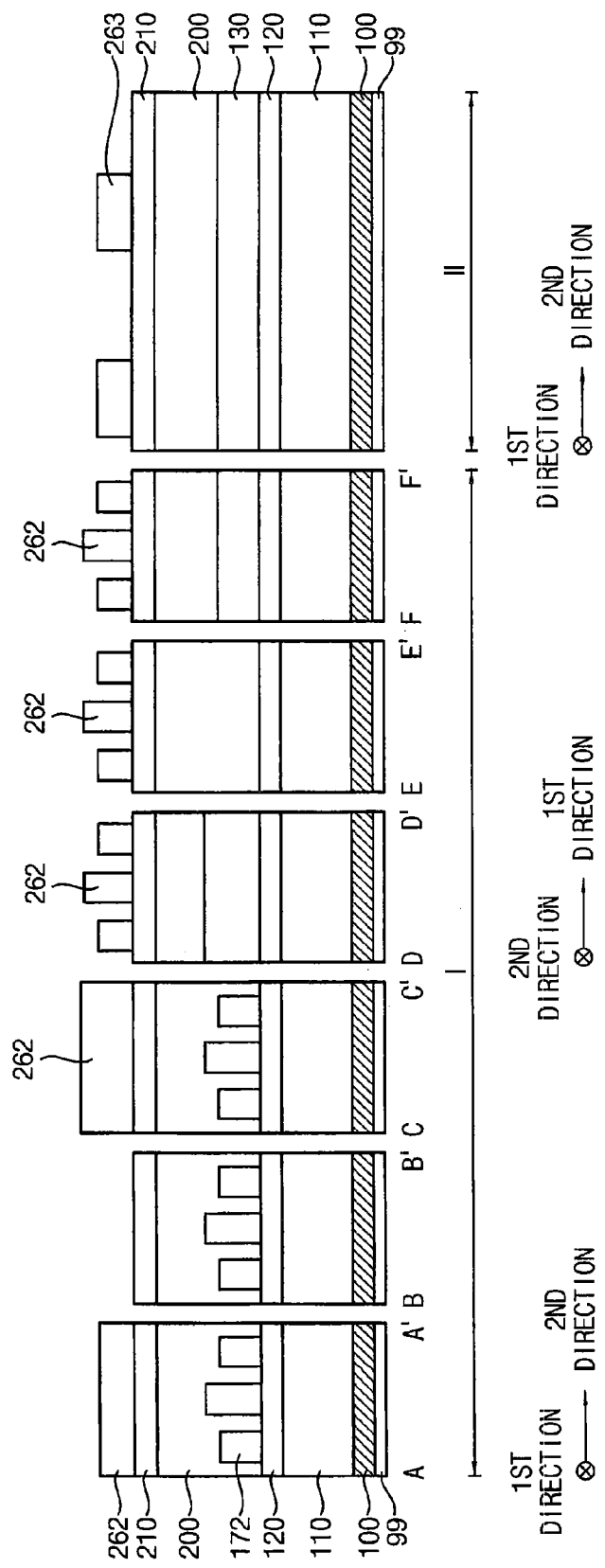

Referring to FIG. 15, a process substantially the same as or similar to that illustrated with reference to FIG. 7 may be performed.

Thus, the sixth layer patterns 232 and the fourth patterns 270 may be removed from the first region I to expose the second masks 262, and the eighth layer patterns 233 may be removed from the second region II to expose the fourth masks 263. Each of the exposed second masks 262 may extend in a straight line in the second direction.

Figure 16:
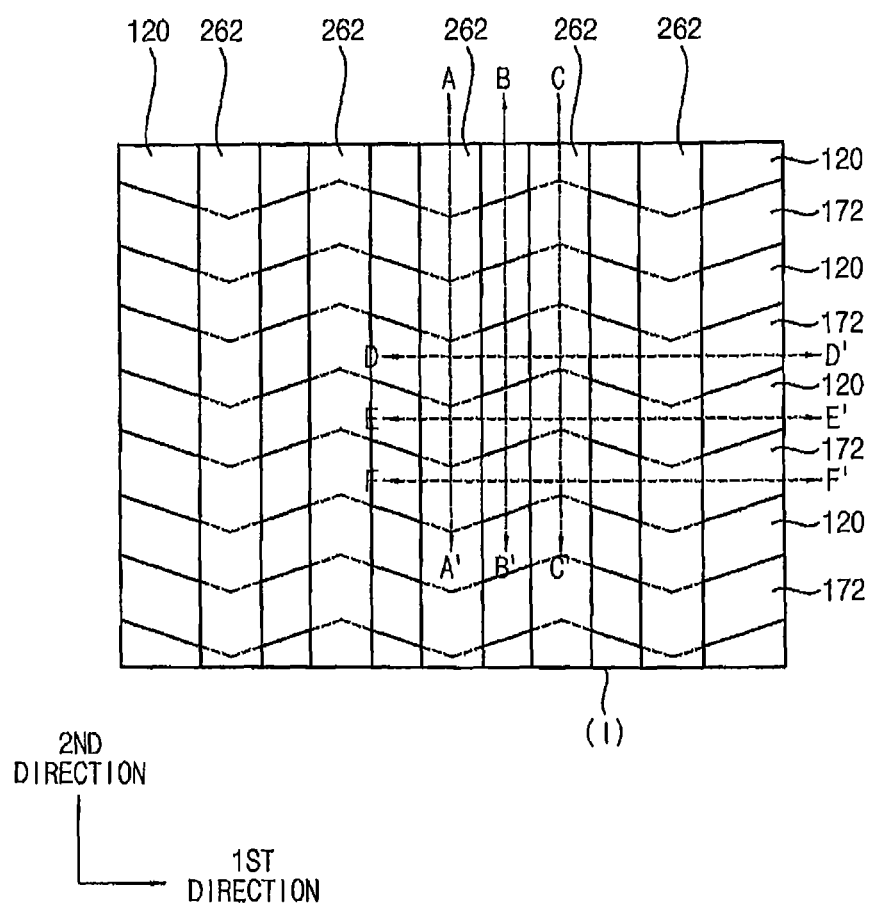
Figure 17:
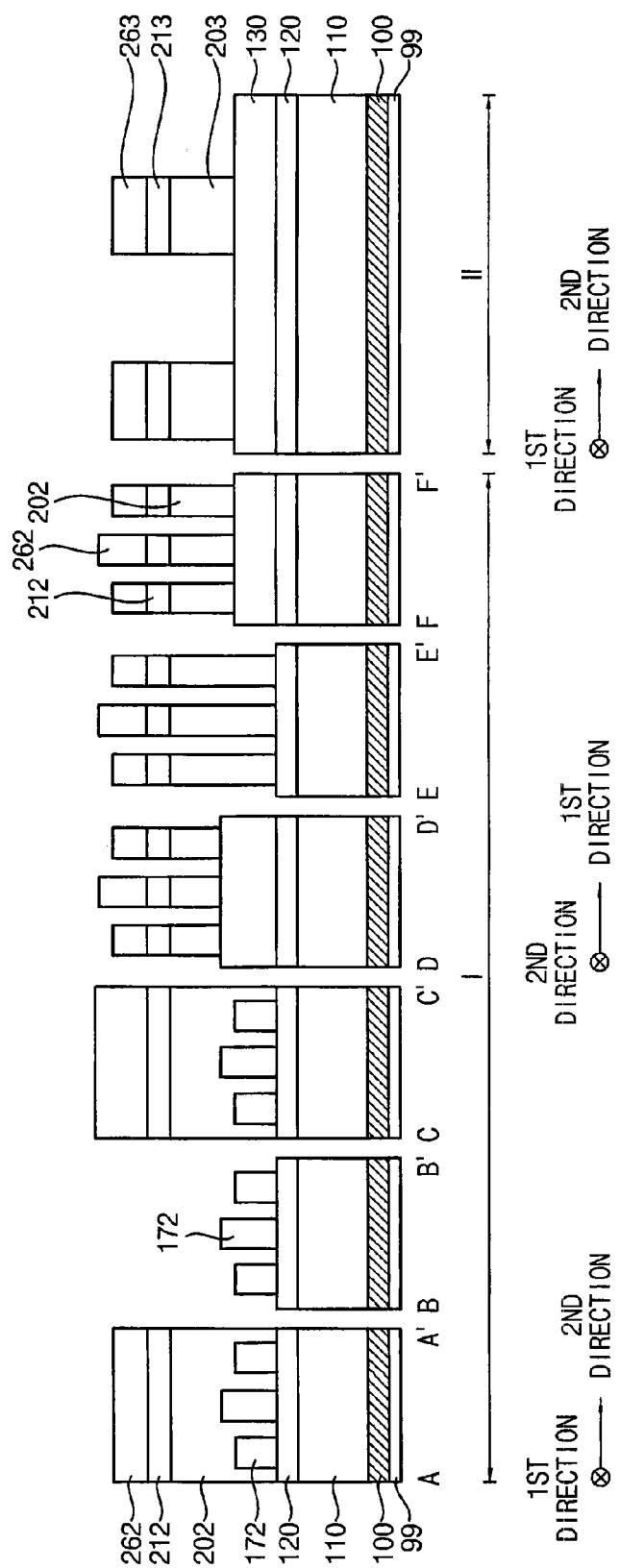

Referring to FIGS. 16 and 17, the fifth layer 210 and the first planarization layer 200 may be etched using the second masks 262 in the first region I and the fourth masks 263 in the second region II as an etching mask to form a fifth layer pattern 212 and a first planarization layer pattern 202 in the first region I and a tenth layer pattern 213 and a second planarization layer pattern 203 in the second region II. Thus, portions of the first masks 172 and the second layer 120 may be exposed in the first region I, and a portion of the first mask layer 130 may be exposed in the second region II.

Figure 18:
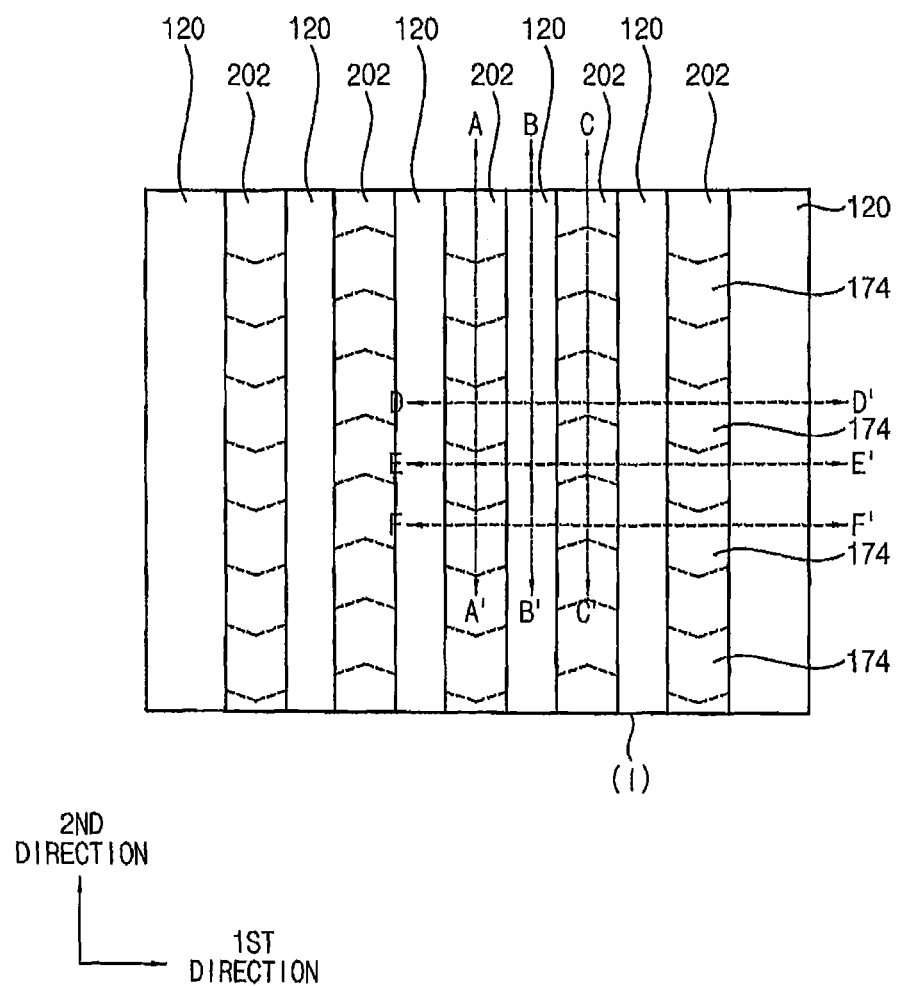
Figure 19:
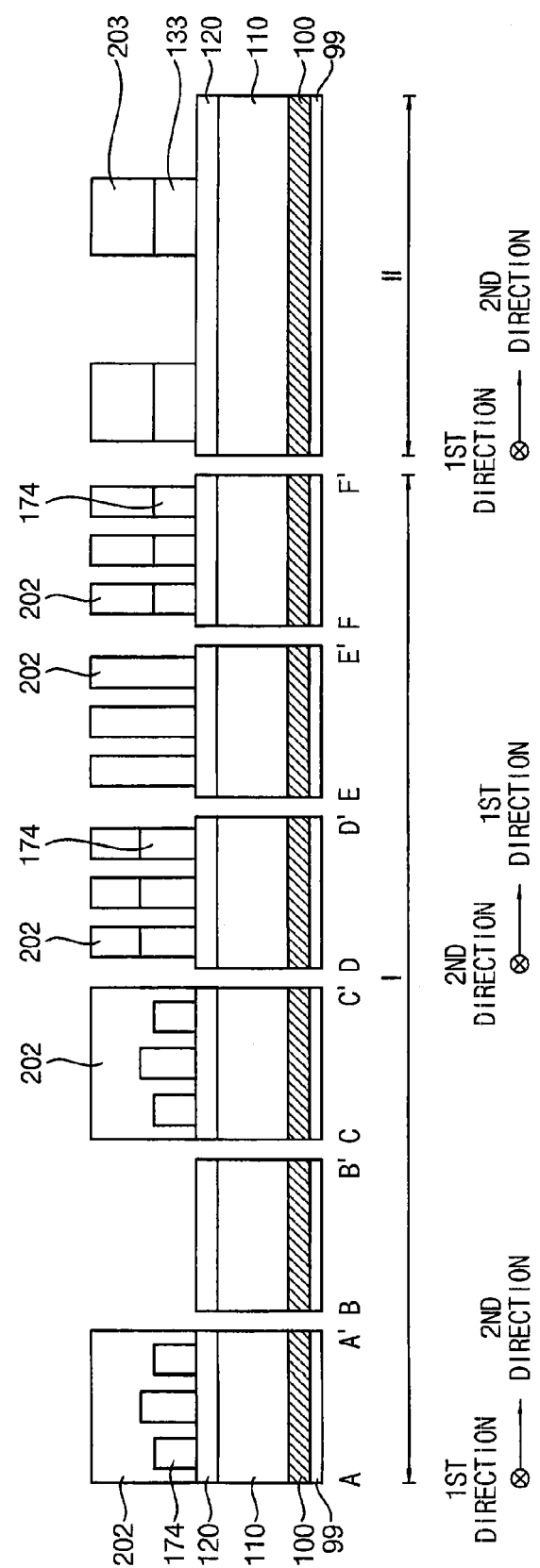

Referring to FIGS. 18 and 19, in the first region I, the second masks 262 and the exposed portion of the first masks 172 may be removed to form a plurality of third masks 174. That is, as the exposed portion of the first masks 172 is removed, each first mask 172 extending in the first direction may be divided into the plurality of third masks 174. Accordingly, the third masks 174 may be formed both in the first and second directions. In the etching process, the fifth layer pattern 212 may also be removed.

In the second region II, the fourth masks 263 and the exposed portion of the first mask layer 130 may be removed to form a plurality of fifth masks 133. In the etching process, the tenth layer pattern 213 may be also removed.

Figure 20:
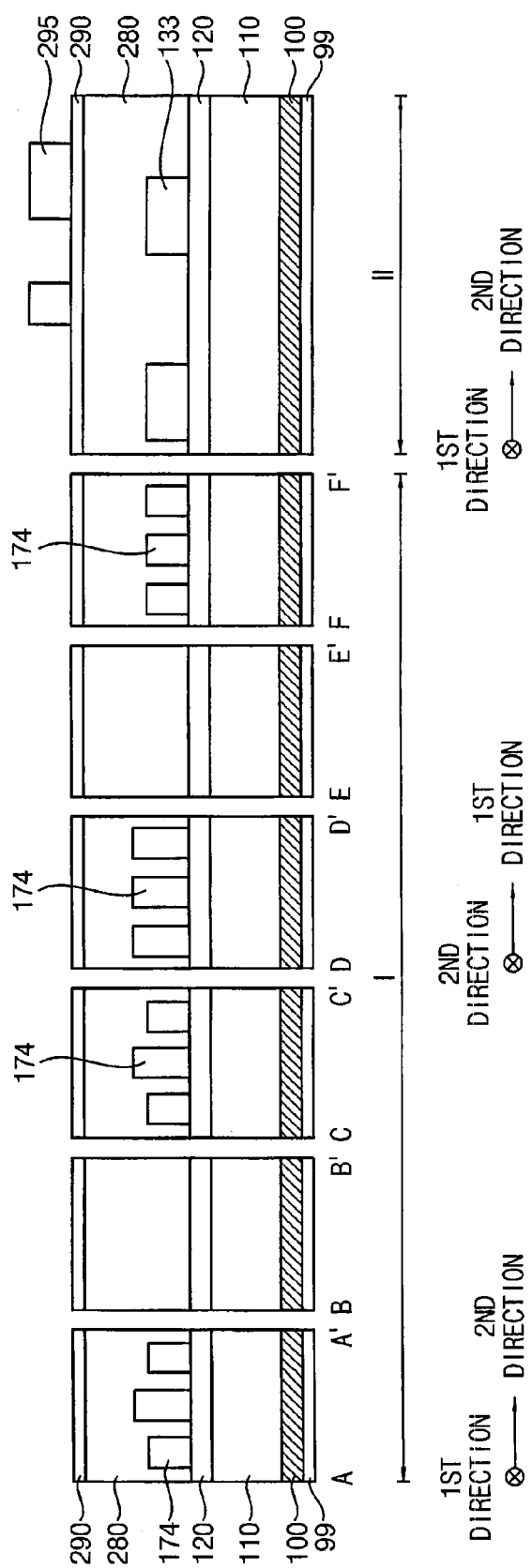

Referring to FIG. 20, a second planarization layer 280 may be formed on the second layer 120 to sufficiently cover the first and second planarization layer patterns 202 and 203 and the third and fifth masks 174 and 133, and an upper portion of the second planarization layer 280 may be planarized. In example embodiments, the second planarization layer 280 may be formed to include a material substantially the same as that of the first and second planarization layer patterns 202 and 203, e.g., SOH. Thus, the first and second planarization layer patterns 202 and 203 may be merged into the second planarization layer 280, and only the merged second planarization layer 280 is shown in FIG. 20.

An eleventh layer 290 may be formed on the second planarization layer 280, and a fifth photoresist pattern 295 may be formed thereon in the second region II.

The eleventh layer 290 may be formed to include an oxynitride, e.g., PE-SiON. In example embodiments, the fifth photoresist pattern 295 may overlap a portion of the sixth mask 133 when viewed from a top side, i.e., the fifth photoresist pattern 295 may vertically overlap the portion of the sixth mask 133.

Figure 22:
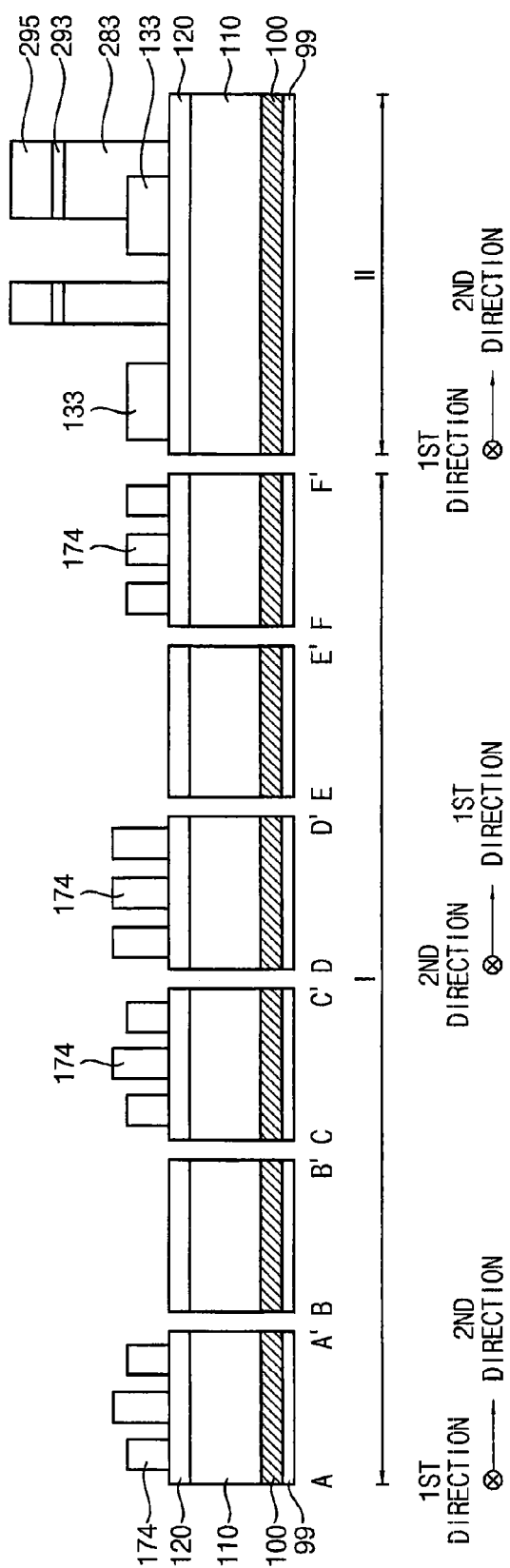

Referring to FIGS. 21 and 22, the eleventh layer 290 and the second planarization layer 280 may be patterned using the fifth photoresist pattern 295 as an etching mask so that the third masks 174 and a portion of the second layer 120 may be exposed in the first region I and an eleventh layer pattern 293 and a third planarization layer pattern 283 may be formed in the second region II. Additionally, the sixth masks 133 and a portion of the second layer 120 may be exposed, however, the portion of the sixth mask 133 overlapped with the fifth photoresist pattern 295 may not be exposed but covered by the third planarization layer pattern 283.

Figure 23:
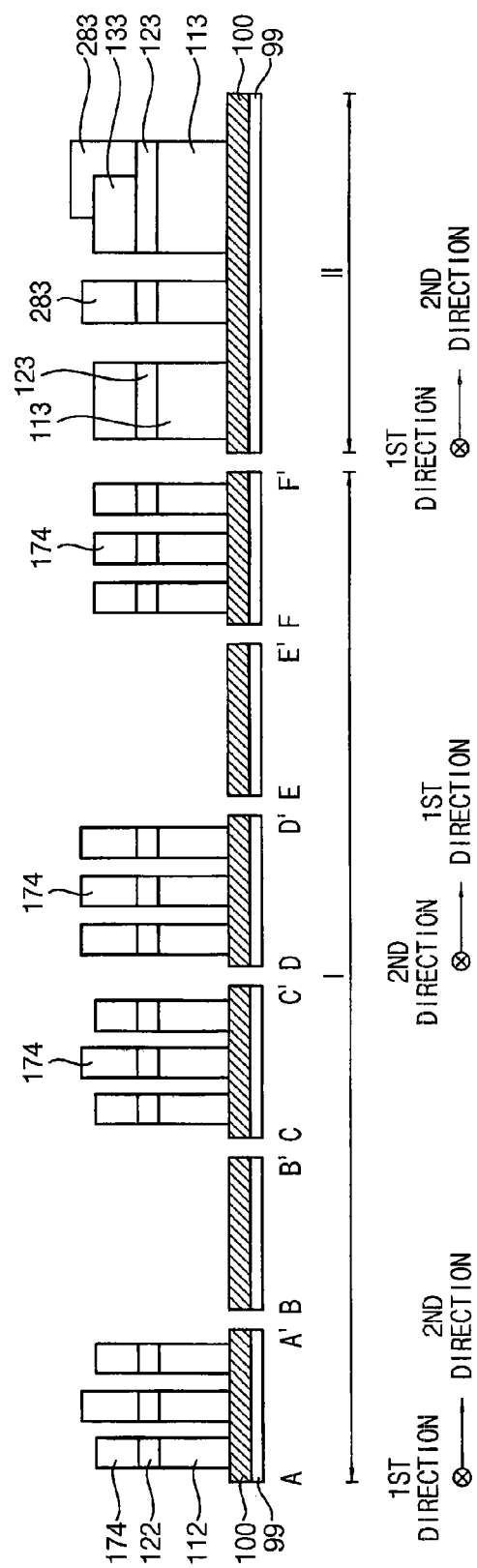

Referring to FIG. 23, after removing the fifth photoresist pattern 295 and the eleventh layer pattern 293, the second layer 120 and the first layer 110 may be patterned using the third masks 174, the sixth masks 133, and the third planarization layer pattern 283 as an etching mask so that a second layer pattern 122 and a first layer pattern 112 may be formed and a portion of the etching object layer 100 may be exposed in the first region I, and a thirteenth layer pattern 123 and a twelfth layer pattern 113 may be formed and a portion of the etching object layer 100 may be exposed in the second region II.

Figure 24:
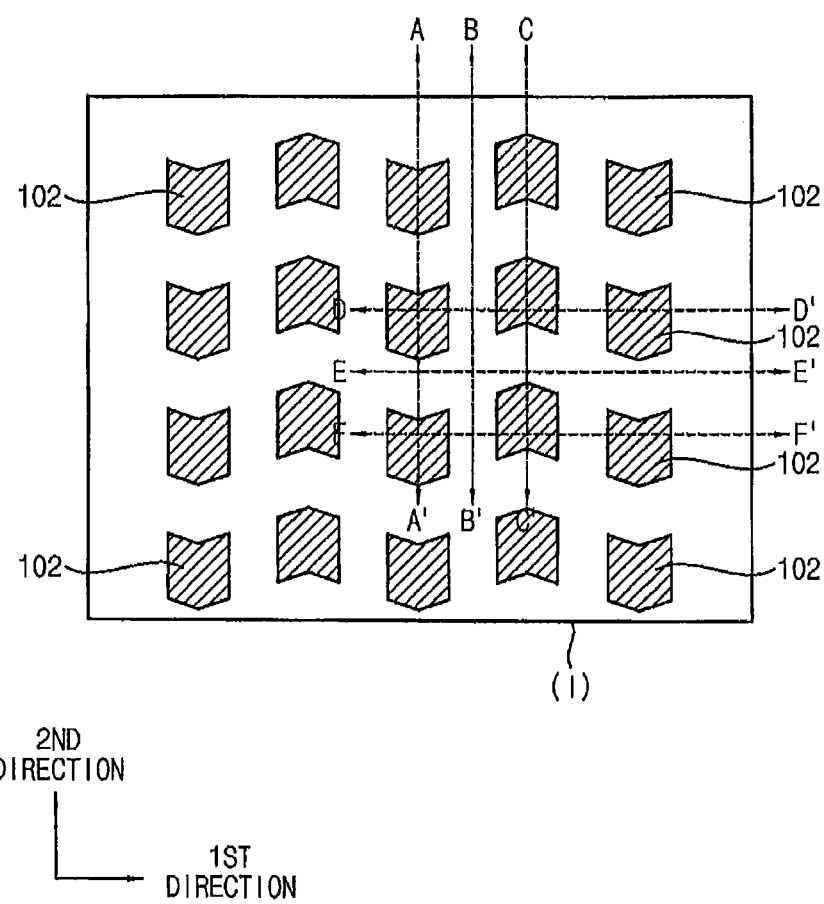

Referring to FIGS. 23 and 24, the third masks 174 and the second layer pattern 122 in the first region I, and the sixth masks 133, the third planarization layer pattern 283, and the thirteenth layer pattern 123 in the second region II may be removed. The exposed portion of the etching object layer 100 in the first region I may be etched using the first layer pattern 112 as an etching mask to form a plurality of pads 102, and the exposed portion of the etching object layer 100 in the second region II may be etched using the twelfth layer pattern 113 as an etching mask to form a plurality of wirings (not shown).

As illustrated above, the pads 102 may be formed by a double patterning technology (DPT) process using the first photoresist pattern 160 extending in a non-linear pattern (also referred to as a waveform) along an axis in the first direction, and by a DPT process using the second photoresist pattern 250 extending in a straight line in the second direction. That is, when the pads 102 and the wirings are not simultaneously formed but only the pads 102 are formed in the first region I, the pads 102 may be formed by performing a DPT process only twice. In a method of forming the pads 102, portions of the etching object layer 100 that are commonly covered by the first mask structure including the first photoresist patterns 160 and the second pattern 180, and the second mask structure including the second photoresist patterns 250 and the fourth pattern 270 may remain to be transformed into the pads 102. An array of the pads 102 (i.e., a pad array) will be discussed in greater detail below with reference to FIG. 25.

When the pads 102 and the wirings are simultaneously formed in the first and second regions I and II, respectively, the pads 102 and the wirings may be formed by performing an etching process three times, which may include performing a DPT process twice. When the wirings are formed in the second region II, not only a portion of the etching object layer 100 commonly covered by the fifth photoresist pattern 295 and the sixth mask 133 but also a portion thereof covered only by one of the fifth photoresist pattern 295 and the sixth mask 133 may remain, so that a portion of the etching object layer 100 covered by any one of the fifth photoresist pattern 295 and the sixth mask 133 may be transformed into the wirings.

According to the shape of the fifth photoresist pattern 295, the wirings may thus be formed by other methods that are different from the above method. For example, after forming a preliminary mask using a photoresist pattern having a size large enough to cover several adjacent patterns of a desired wiring, the preliminary mask may be divided into a plurality of masks using a photoresist pattern covering only a portion of the preliminary mask as an etching mask, and finally the etching object layer 100 may be patterned using the mask as an etching mask to form the desired wiring.

The method of forming the pads 102 and the wirings may be used to manufacture a semiconductor device including a cell region and a peripheral circuit region. That is, the method of forming the pads 102 in the first region I may be used (e.g., to form capacitor landing pads in the cell region), and the method of forming the wirings in the second region II may be used, (e.g., to form bit lines in the peripheral circuit region).

Figure 25:
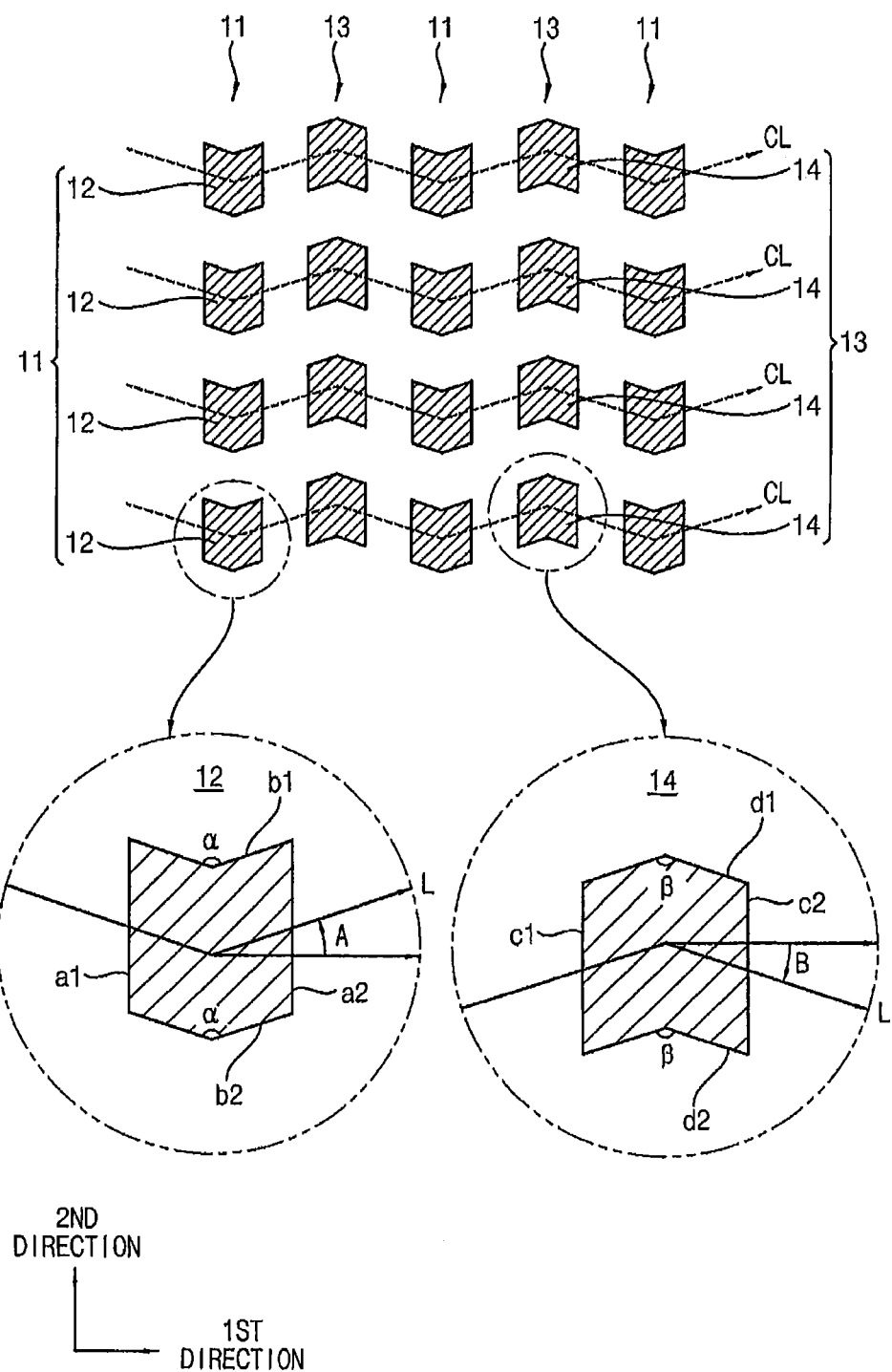

FIG. 25 is a plan view illustrating a pad array in accordance with example embodiments.

Referring to FIG. 25, the pad array may include a first pad column 11 and a second pad column 13. In example embodiments, a plurality of first pad columns 11 may be formed in the first direction, and also a plurality of second pad columns 13 may be formed in the first direction. The first and second pad columns 11 and 13 may be arranged alternately and repeatedly in the first direction. That is, the pad array may have a structure in which a first pad column 11, a second pad column 13, a first pad column 11, and a second pad column 13 are arranged in this order. Thus, each second pad column 13 may be interposed between the adjacent first pad columns 11. In example embodiments, adjacent first and second pad columns 11 and 13 may be disposed at a given distance from each other in the first direction.

Each first pad column 11 may have a plurality of first pads 12 disposed in the second direction substantially perpendicular to the first direction, and each second pad column 13 may have a plurality of second pads 14 disposed in the second direction. In example embodiments, in each first pad column 11, the first pads 12 may be disposed at a given distance from each other in the second direction, and in each second pad column 13, the second pads 14 may be disposed at a given distant from each other in the second direction.

Each first pad 12 may have four sides, and first and second sides a1 and a2 of the four sides that are opposite to each other may be substantially straight lines, each of which may be parallel to the second direction. The other two opposite sides of the four sides (i.e., third and fourth sides b1 and b2) may be curved (with side b1 being concave and with side b2 being convex) in the second direction. Particularly, the third side b1 of each first pad 12 may include two straight lines, which may form a first angle α therebetween, and the fourth side b2 of each first pad 12 may include two straight lines that are parallel to the respective two lines of the third side b1. In example embodiments, the first angle α may be an obtuse angle.

First and second pads 12 and 14 adjacent to each other in the first direction may form point symmetry with respect to a point located therebetween. Thus, each second pad 14 may also have four sides, and first and second sides c1 and c2 of the four sides that are opposite to each other may be substantially straight lines each of which may be parallel to the second direction. Additionally, the other two opposite sides of the four sides (i.e., third and fourth sides d1 and d2) may be curved (with side d2 being concave and with side d1 being convex) in the second direction. Particularly, the third side d1 of each second pad 14 may include two straight lines, which may form a second angle β therebetween, and the fourth side d2 of each second pad 14 may include two straight lines that are parallel to the respective two lines of the third side d1. In example embodiments, the second angle β may be an obtuse angle, which may be substantially the same as the first angle α.

According to the shapes of the first and second pads 12 and 14, the first and second pads 12 and 14 may be arranged in a pattern or waveform along an axis in the first direction. That is, the first and second pads 12 and 14 may be disposed in a zigzag fashion along the first direction.

An imaginary central line (CL) connecting centers of the first and second pads 12 and 14 adjacent to each other in the first direction may form an acute angle with the first direction or may be parallel with the first direction.

The counterclockwise direction may be considered as a positive angular direction. If a portion of the central line CL connecting a center of the first pad 12 to a center of the second pad 14 in this order forms a third angle A with the first direction, the third angle A may be a positive value. Additionally, if a portion of the central line CL connecting a center of the second pad 14 to a center of the first pad 12 in this order may form a fourth angle B with the first direction, the fourth angle B may be a negative value.

Alternatively, if the angular direction is not considered, i.e., if only the absolute value of the angle is considered, the third angle A or the fourth angle B may be in a range of about 0 to about 90 degrees. In example embodiments, the third and fourth angles A and B may be in a range of about 0 to about 30 degrees. When the third and fourth angles A and B are 30 degrees, the centers of the first and second pads 12 and 14 may form a honeycomb structure, that is, the centers of the first and second pads 12 and 14 may be disposed at vertices and centers of hexagons. Thus, in accordance with example embodiments, the first and second pads 12 and 14 may be arranged not only in a honeycomb structure but also in other structures.

Figure 26:
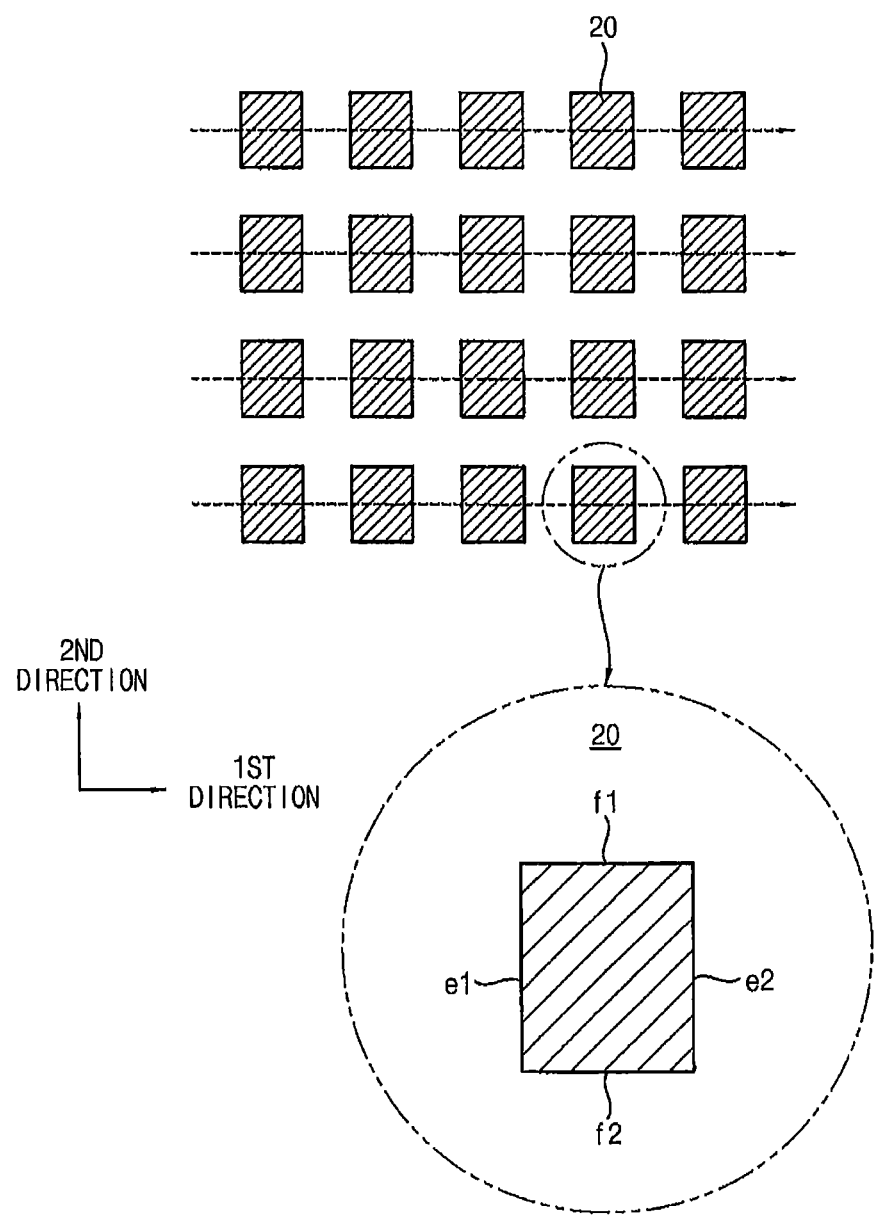

FIG. 26 is a plan view illustrating a pad array in accordance with example embodiments.

Referring to FIG. 26, the pad array may include a plurality of third pads 20 arranged both in the first and second directions substantially perpendicular to each other. Unlike the first and second pads 12 and 14 illustrated with reference to FIG. 25, each third pad 20 may have first and second sides e1 and e2 substantially parallel to the second direction, and third and fourth sides f1 and f2 substantially parallel to the first direction. That is, unlike the first and second pads 12 and 14, the third and fourth sides f1 and f2 of each third pad 20 may be neither concave nor convex but flat/straight in the second direction, and thus each third pad 20 may have a rectangular shape.

The pad array may be formed using a sixth photoresist pattern (not shown) extending in a straight line along the first direction that is different from the first photoresist pattern 160 extending in a pattern/waveform along the first direction in FIG. 1.

According to present inventive concepts, the first mask structure includes the first photoresist patterns 160 extending in a non-linear pattern (also referred to as a waveform) along an axis in the first direction and the second pattern 180 between the first photoresist patterns 160 formed by a DPT process, and the second mask structure includes the second photoresist patterns 250 extending in a straight line in the second direction and the fourth pattern 270 between the second photoresist patterns 250 formed by a DPT process. Together, the first and second mask structures may serve as an etching mask for forming the etching object layer 100 so that only portions of the etching object layer 100 covered by both of the first and second mask structures may remain to serve as pads 12 and 14 and the pad array may be defined. The arrangement of the pads 12 and 14 may be changed by controlling a degree of fluctuation of the first photoresist pattern 160 toward the second direction, i.e., the amplitude, while it extends in the first direction, and this may correspond to the first and second angles α and β of the first and second pads 12 and 14, respectively, or the third and fourth angles A and B between the central line CL and the first direction.

That is, as the amplitude of the first photoresist pattern 160 toward the second direction decreases, the first and second angles α and β may increase, and the third and fourth angles A and B may decrease. Thus, when the first photoresist pattern 160 does not fluctuate substantially toward the second direction, i.e., when the sixth photoresist pattern is used, the third pads 20 may not be arranged in a zigzag fashion but linearly in the first direction, and each third pad 20 may have a rectangular shape. In this case, the first and second angles α and β or the third and fourth angles A and B may be substantially zero.

Figure 27:
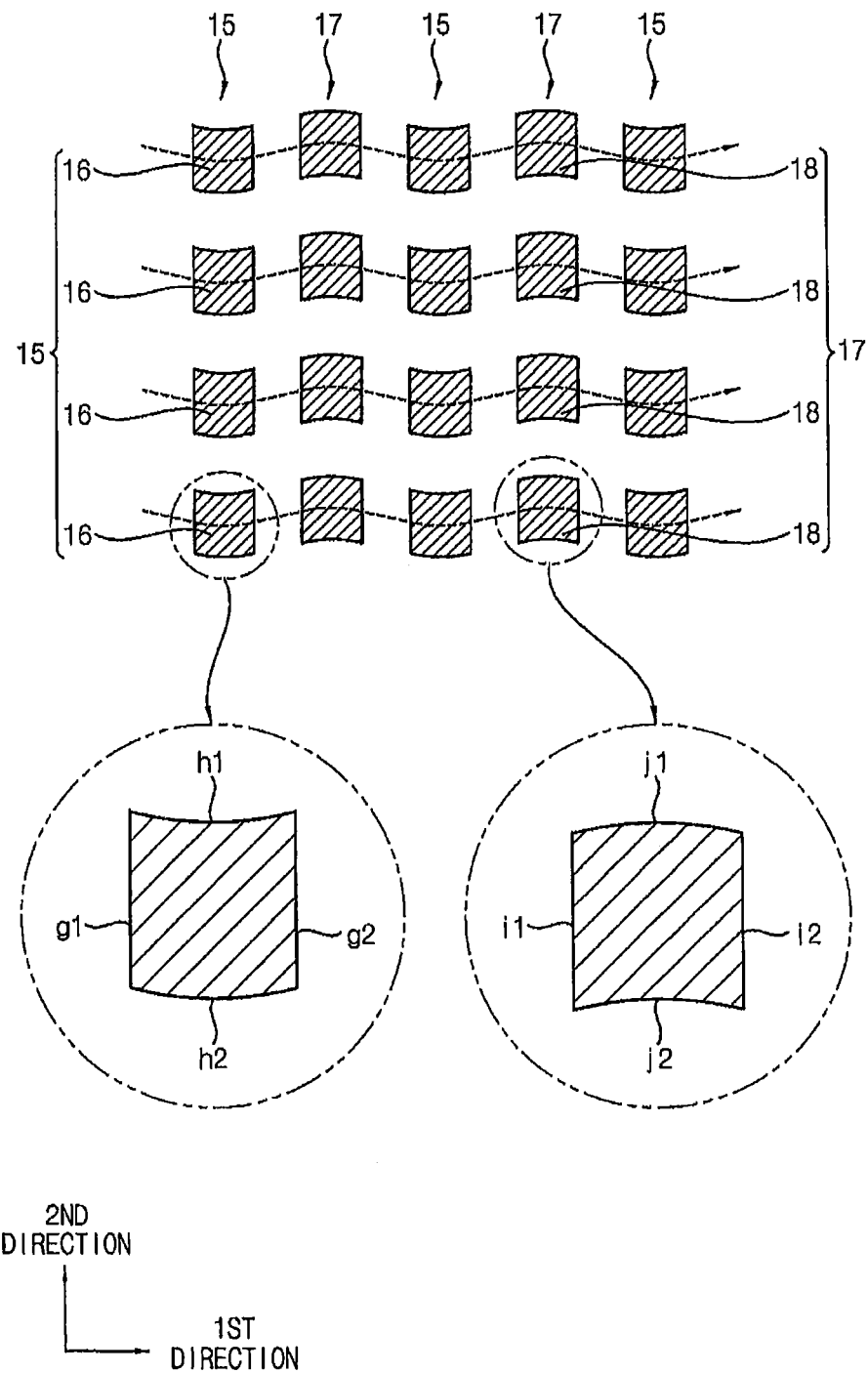

FIG. 27 is a plan view illustrating a pad array in accordance with example embodiments.

Referring to FIG. 27, the pad array may include a fourth pad column 15 and a fifth pad column 17. In example embodiments, a plurality of fourth pad columns 15 may be formed in the first direction, and also a plurality of fifth pad columns 17 may be formed in the first direction. The fourth and fifth pad columns 15 and 17 may be arranged alternately and repeatedly in the first direction, and may be disposed at a given distance from each other in the first direction.

Each fourth pad column 15 may have a plurality of fourth pads 16 disposed in the second direction substantially perpendicular to the first direction, and each fifth pad column 17 may have a plurality of fifth pads 18 disposed in the second direction. In example embodiments, in each fourth pad column 15, the fourth pads 16 may be disposed at a given distance from each other in the second direction, and in each fifth pad column 17, the fifth pads 18 may be disposed at a given distant from each other in the second direction.

Each fourth pad 16 may have four sides, and first and second sides g1 and g2 of the four sides that are opposite to each other may be substantially straight lines each of which may be parallel to the second direction. The other two opposite sides of the four sides, i.e., third and fourth sides h1 and h2 may be parallel curves that are respectively concave and convex in the second direction.

Fourth and fifth pads 16 and 18 adjacent to each other in the first direction may form point symmetry with respect to a point located therebetween. Thus, each fifth pad 18 may also have four sides, and first and second sides i1 and i2 of the four sides that are opposite to each other may be substantially straight lines each of which may be parallel to the second direction. Additionally, the other two opposite sides of the four sides, i.e., third and fourth sides j1 and j2 may be parallel curves that are respectively convex and concave in the second direction.

According to the shapes of the fourth and fifth pads 16 and 18, the fourth and fifth pads 16 and 18 may be arranged in a waveform along the first direction. That is, the fourth and fifth pads 16 and 18 may be disposed in a zigzag fashion along the first direction. However, unlike the first and second pads 12 and 14 in FIG. 25, each of the third and fourth sides h1, h2, j1 and j2 of the fourth and fifth pads 16 and 18 in FIG. 27 may not be two straight lines but may be curved (also referred to as bent).

The pad array may be formed using a seventh photoresist pattern (not shown) extending in a curve along the first direction that is different from the first photoresist pattern 160 in FIG. 1.

FIGS. 28, 30, 32, 34, 36, 38, 40, 43 and 44 are plan views illustrating stages of a method of manufacturing a semiconductor device in accordance with example embodiments, and FIGS. 29, 31, 33, 35, 37, 39, 41, 42, 45 and 46 are cross-sectional views illustrating stages of a method of manufacturing the semiconductor device in accordance with example embodiments. Each of the cross-sectional views includes cross-sections of the corresponding plan view cut along lines G-G', H-H', K-K' and L-L', respectively. The lines G-G' and H-H' extend in a second direction substantially parallel to a top surface of a substrate, and the lines K-K' and L-L' extend in a first direction substantially parallel to the top surface of the substrate and substantially perpendicular to the second direction.

In this method, the method of forming the pads in the first region illustrated with reference to FIGS. 1 to 27 may be applied to forming capacitor landing pads in a cell region of a dynamic random access memory (DRAM) device. The method of forming the wirings in the second region performed together with the method of forming the pads in the first region may be applied to forming various patterns in a peripheral circuit region of the DRAM device (e.g., bit lines), however, other such patterns are not illustrated herein. Hereinafter, only the method of manufacturing the cell region of the DRAM device will be illustrated.

Figure 29:
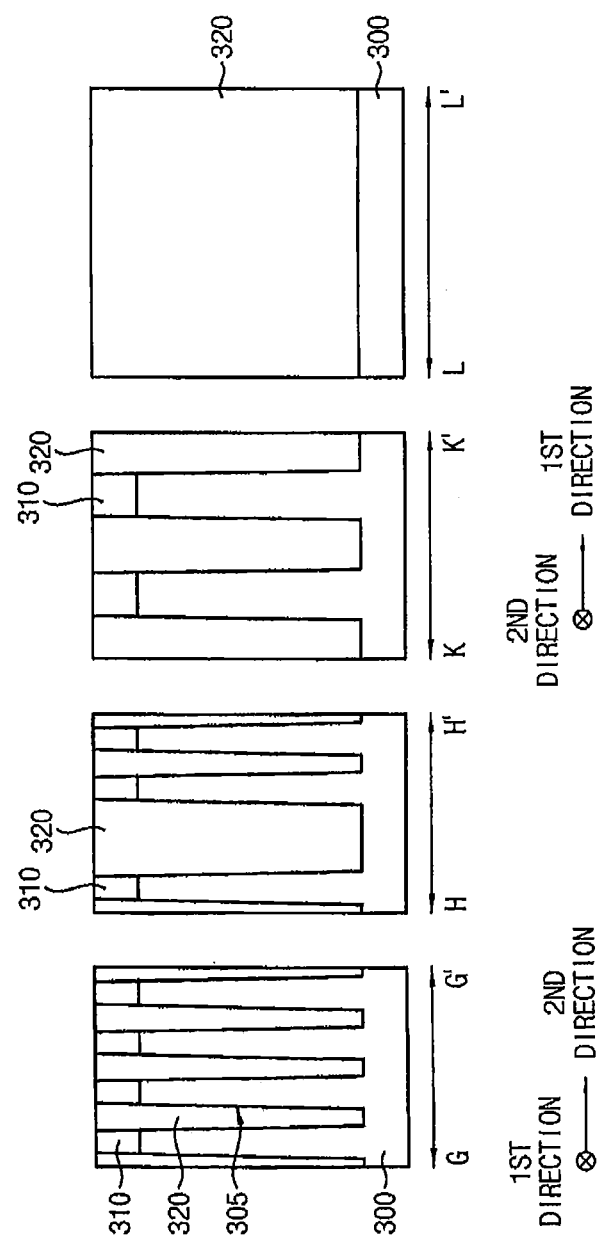

Referring to FIGS. 28 and 29, a first hard mask 310 may be formed on a substrate 300, and an upper portion of the substrate 300 may be etched using the first hard mask 310 as an etching mask to form a first trench 305. For example, the substrate 300 may be a silicon substrate, a germanium substrate, a silicon-germanium substrate, a silicon-on-insulator (SOI) substrate, a germanium-on-insulator (GOI) substrate, etc. The first hard mask 310 may be formed to include a nitride, e.g., silicon nitride.

An isolation layer may be formed on the substrate 300 to sufficiently fill the first trench 305, and an upper portion of the isolation layer may be planarized until a top surface of the substrate 300 is exposed to form an isolation layer pattern 320 in the first trench 305. The isolation layer may be formed to include an oxide, e.g., silicon oxide.

A region of the substrate 300 on which the isolation layer pattern 320 is formed may be defined as a field region, and a region of the substrate 300 on which no isolation layer pattern is formed may be defined as an active region. In example embodiments, a plurality of active regions may be formed, and each active region may extend in a third direction that is substantially parallel to the top surface of the substrate 300, but that is neither parallel nor perpendicular to the first and second directions.

Impurities may be implanted into upper portions of the substrate 300 to form impurity regions (not shown). The impurity regions may form a transistor together with a first gate structure 360 (refer to FIG. 31) subsequently formed, and may serve as source/drain regions of the transistor.

Figure 30:
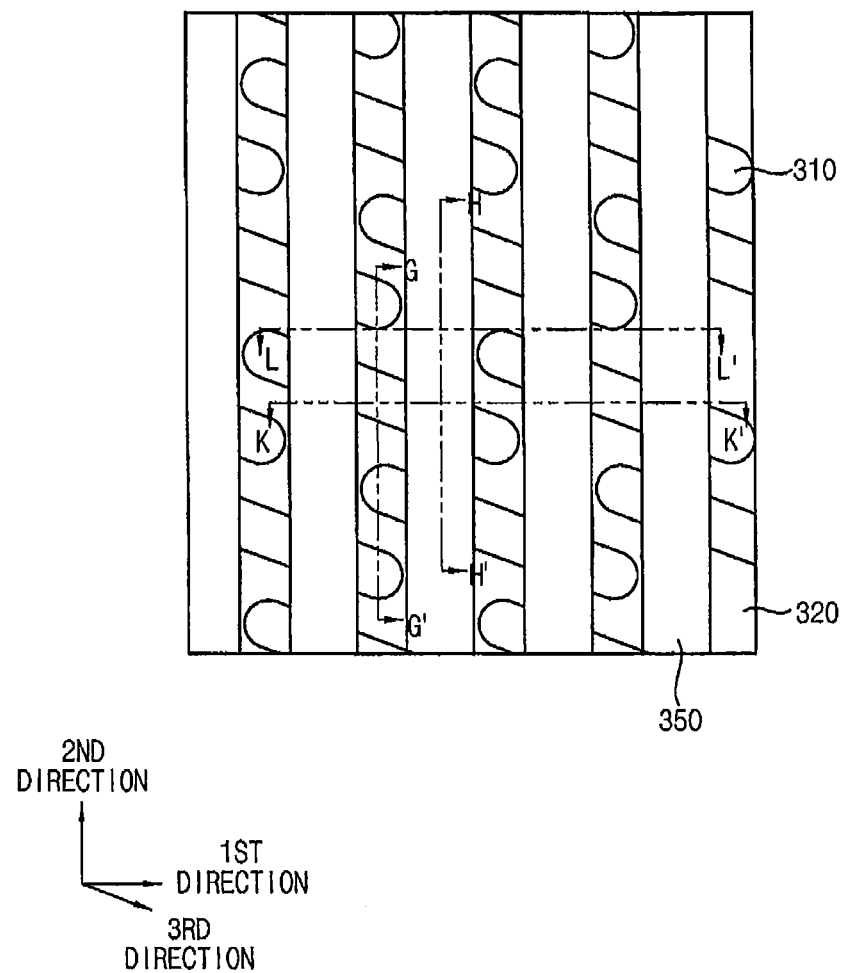
Figure 31:
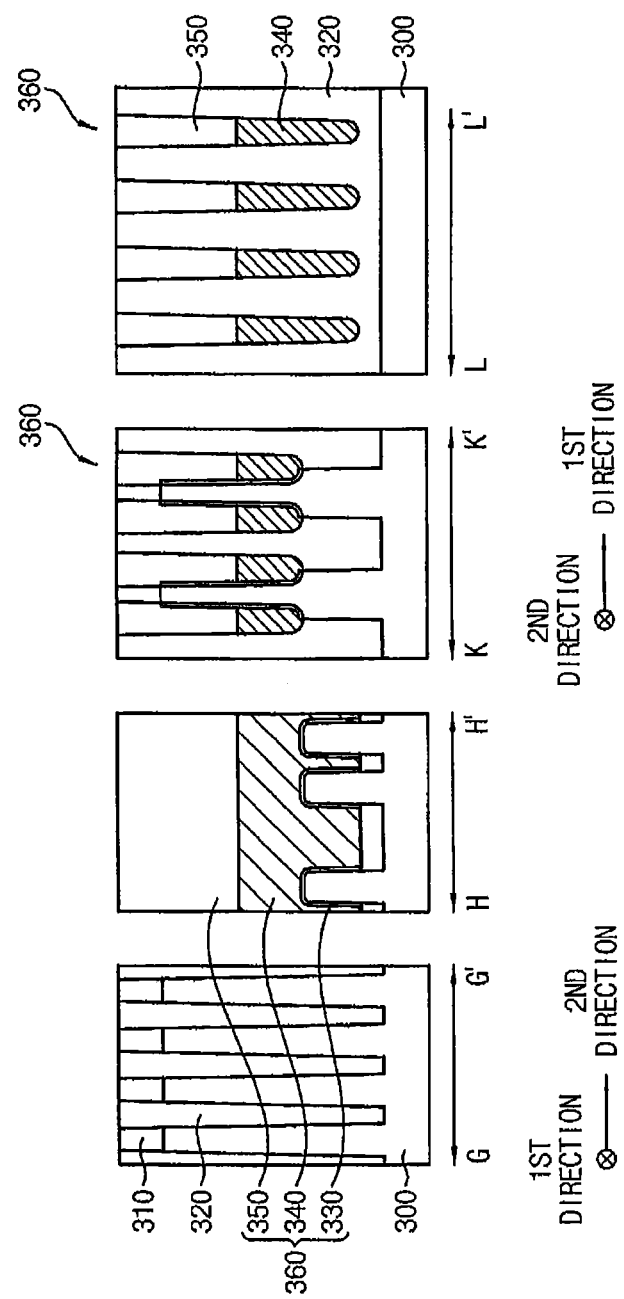

Referring to FIGS. 30 and 31, the first hard mask 310, the substrate 300 and the isolation layer pattern 320 may be partially removed to form second trenches each of which may extend in the second direction. The second trenches may be formed to have different depths at the substrate 300 and the isolation layer pattern 320 according to the etching selectivity therebetween. In example embodiments, two second trenches may be formed in each active region of the substrate 300.

A first gate insulation layer 330 may be formed on upper surfaces of the substrate 300 exposed by the second trenches, and a first gate electrode 340 and a capping layer pattern 350 may be sequentially formed in each second trench. The first gate electrode 340 may fill a lower portion of each second trench and the capping layer pattern 350 may fill an upper portion of each second trench.

In example embodiments, the first gate insulation layer 330 may be formed using a thermal oxidation process or a chemical vapor deposition (CVD) process, and thus may be formed to include an oxide, e.g., silicon oxide.

The first gate electrode 340 may be formed by forming a first gate electrode layer on the first gate insulation layer 330, the first hard mask 310 and the isolation layer pattern 320 to sufficiently fill the second trenches, and removing an upper portion of the first gate electrode layer through an etch back process and/or a CMP (chemical mechanical polishing) process. The first gate electrode layer may be formed to include a metal, e.g., tungsten, titanium, tantalum, etc., or a metal nitride, e.g., tungsten nitride, titanium nitride, tantalum nitride, etc.

The capping layer pattern 350 may be formed by forming a capping layer on the first gate electrode 340, the first gate insulation layer 330, the first hard mask 310 and the isolation layer pattern 320 to sufficiently fill remaining portions of the second trenches, and planarizing an upper portion of the capping layer until top surfaces of the first hard mask 310 and the isolation layer pattern 320 may be exposed. The capping layer may be formed to include a nitride, e.g., silicon nitride.

By the above process, the first gate structure 360 including the first gate insulation layer 330, the first gate electrode 340 and the capping layer pattern 350 may be formed in each second trench. In example embodiments, the first gate structure 360 may extend in the second direction.

Figure 33:
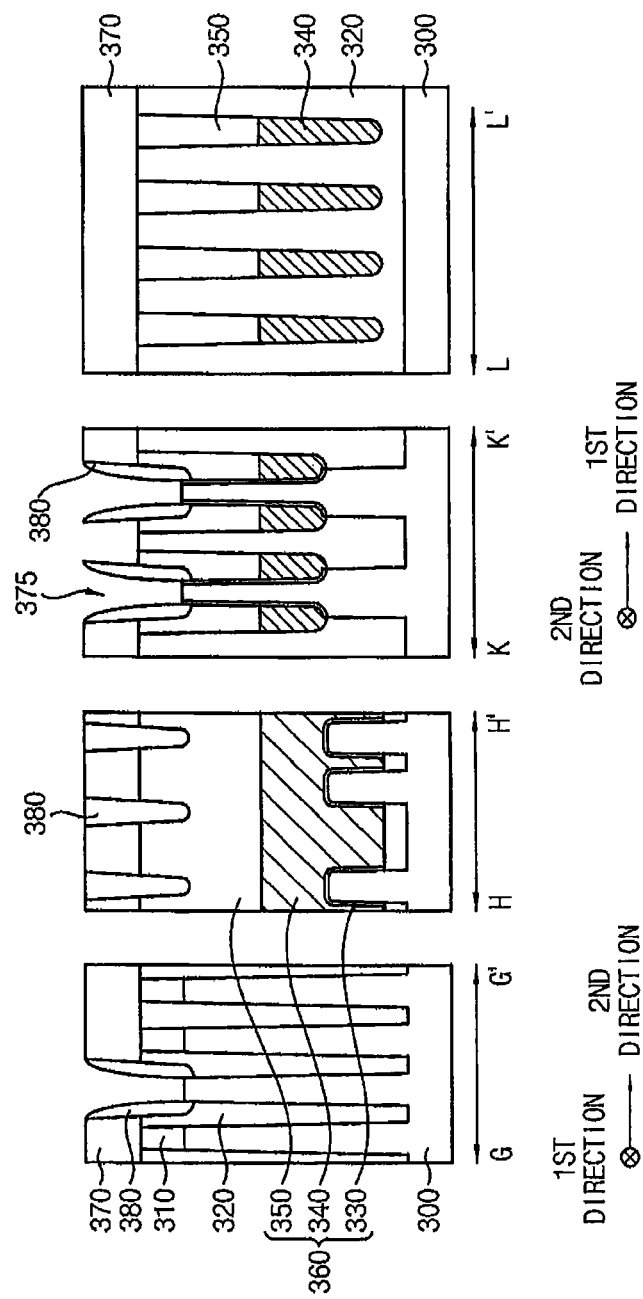

Referring to FIGS. 32 and 33, a first insulating interlayer 370 may be formed on the first hard mask 310, the isolation layer pattern 320 and the capping layer pattern 350, and the first insulating interlayer 370 and the first hard mask 310 may be partially removed to form first contact holes 375 exposing the active regions of the substrate 300, respectively. In example embodiments, each first contact hole 375 may expose a central top surface of each active region. When the first contact holes 375 are formed, the capping layer pattern 350 and the isolation layer pattern 320 may also be partially removed.

A first spacer 380 may be formed on a sidewall of each first contact hole 375. The first spacers 380 may be formed by forming a first spacer layer on the sidewalls of the first contact holes 375, the exposed top surface of the active regions, and the first insulating interlayer 370, and anisotropically etching the first spacer layer. The first spacer layer may be formed to include a nitride, e.g., silicon nitride.

Figure 35:
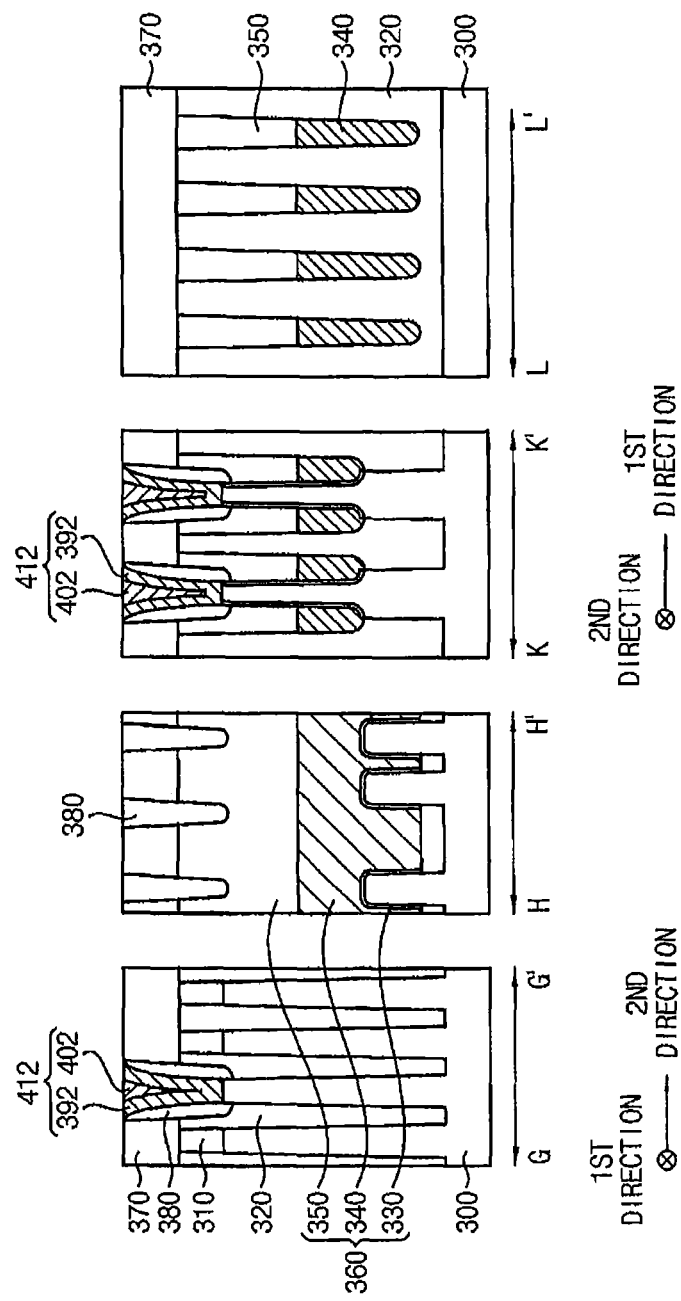

Referring to FIGS. 34 and 35, a first contact plug 412 filling a remaining portion of each first contact hole 375 may be formed on the exposed top surface of the active region and the first spacer 380. The first contact plug 412 may include a first metal layer pattern 402 and a barrier layer pattern 392 surrounding the first metal layer pattern 402.

The first contact plugs 412 may be formed by forming a barrier layer on the exposed top surface of the active regions, the first spacers 380 and the first insulating interlayer 370, by forming a first metal layer to sufficiently fill remaining portions of the first contact holes 375, and by planarizing upper portions of the barrier layer and the first metal layer until a top surface of the first insulating interlayer 370 is exposed. The barrier layer may be formed to include a metal nitride (e.g., tungsten nitride, titanium nitride, tantalum nitride, etc.), and the first metal layer may be formed to include a metal (e.g., tungsten, aluminum, copper, etc.). Alternatively, the first contact plugs 412 may be formed to include doped polysilicon.

Figure 37:
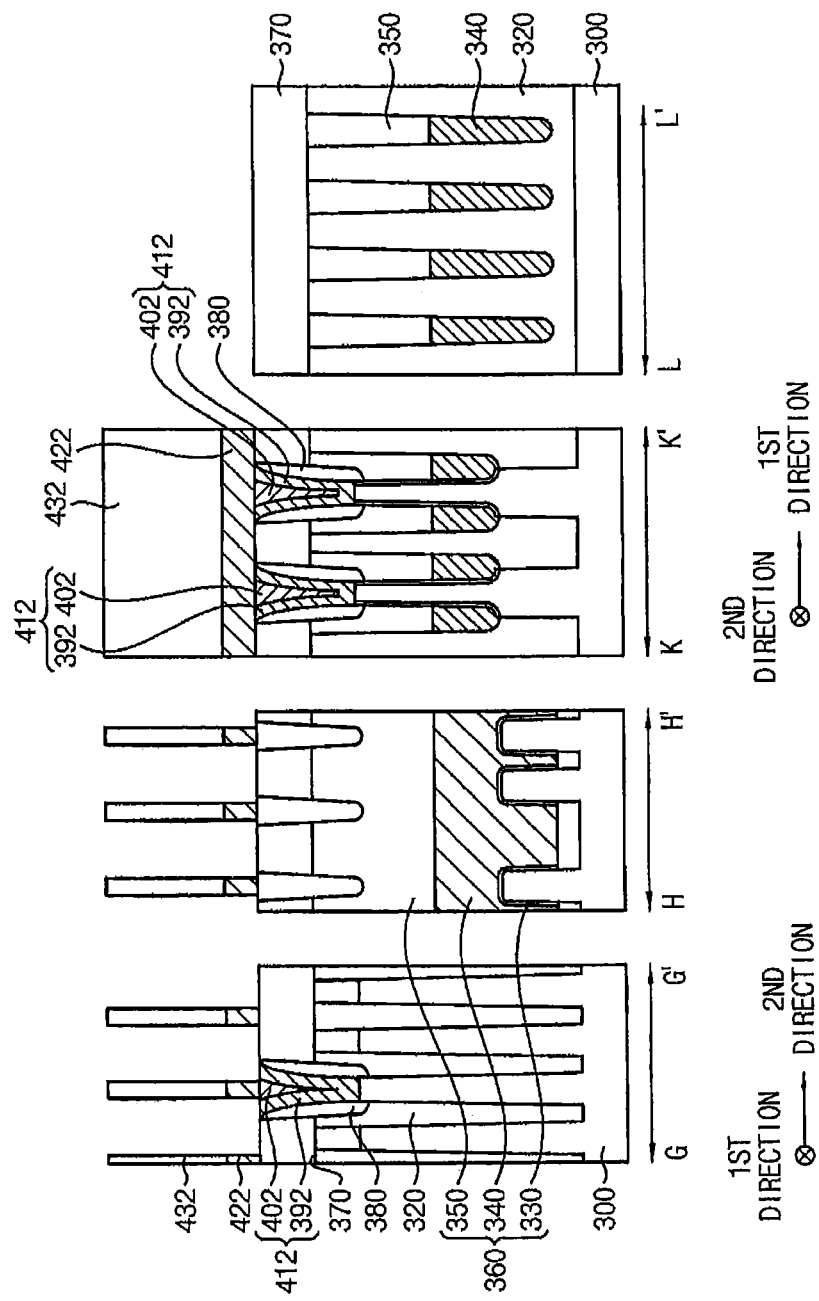

Referring to FIGS. 36 and 37, a first bit line 422 and a second hard mask 432 may be sequentially formed on the first insulating interlayer 370 to contact the first plugs 412.

The first bit line 422 and the second hard mask 432 may be formed by sequentially forming a second metal layer and a second hard mask layer on the first insulating interlayer 370, the first contact plugs 412, and the first spacers 380, and by patterning the second hard mask layer and the second metal layer using a photolithography process. In example embodiments, each of the first bit line 422 and the second hard mask 432 may extend in the first direction, and a plurality of first bit lines 422 and a plurality of second hard masks 432 may be formed in the second direction. The second metal layer may be formed to include a metal, e.g., tungsten, aluminum, copper, etc., and the second hard mask layer may be formed to include a nitride, e.g., silicon nitride.

Figure 39:
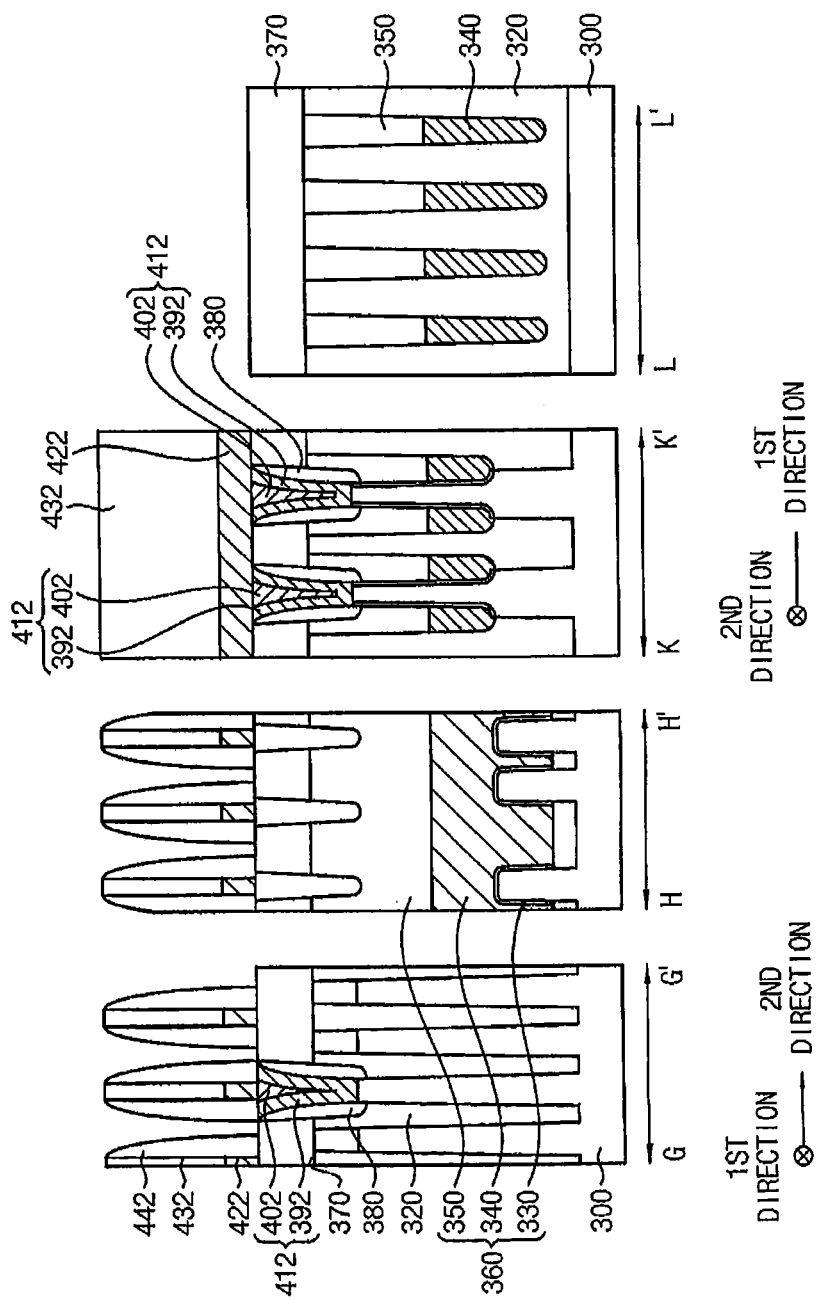

Referring to FIGS. 38 and 39, a second spacer 442 may be formed on sidewalls of each first bit line 422 and each second hard mask 432.

The second spacers 442 may be formed by forming a second spacer layer on the first bit lines 422, the second hard masks 432, the first contact plugs 412 and the first insulating interlayer 370, and by anisotropically etching the second spacer layer. The second spacer layer may be formed to include a nitride, e.g., silicon nitride. In example embodiments, the second spacer 442 may extend in the first direction, and a plurality of second spacers 442 may be formed in the second direction.

The bit line 422, the second hard mask 432 and the second spacer 442 may define a first bit line structure.

Figure 40:
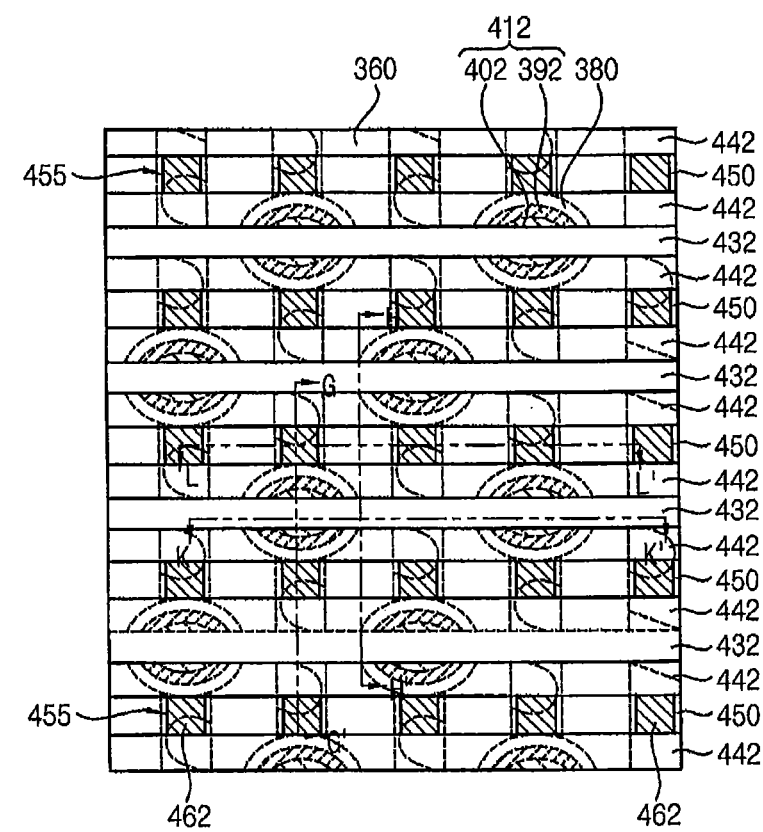
Figure 41:
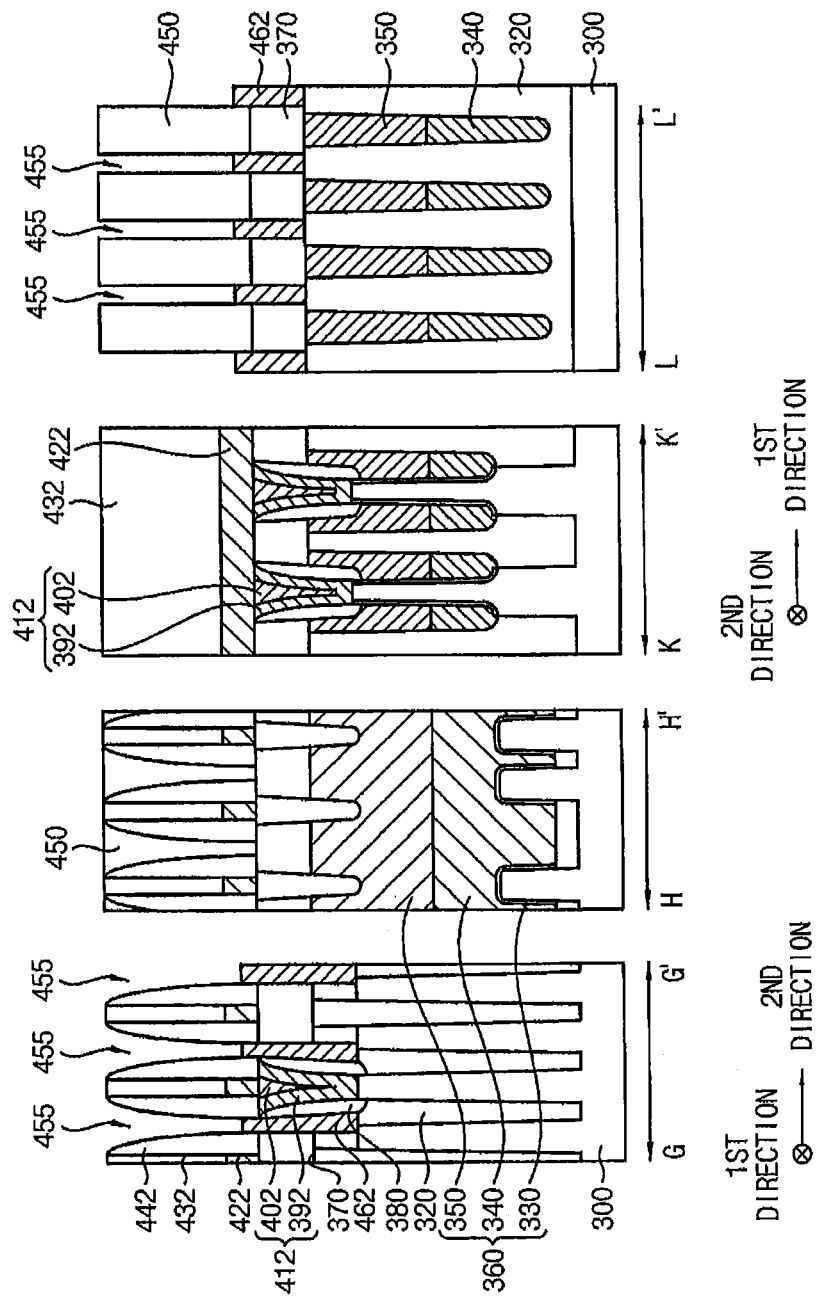

Referring to FIGS. 40 and 41, a second insulating interlayer 450 may be formed on the first insulating interlayer 370 to cover the first bit line structures, and the second insulating interlayer 450, the first insulating interlayer 370 and the first hard mask 310 may be partially etched to form second contact holes 455 exposing top surfaces of the active regions, respectively. When the second contact holes 455 are formed, the isolation layer pattern 320 may be partially etched. In example embodiments, a plurality of second contact holes 455 may be formed in the first direction between the first bit line structures. In example embodiments, the second contact holes 455 may be formed to be self-aligned with the first bit line structures, and two second contact holes 455 may be formed on each active region.

A second contact plug 462 filling a lower portion of each second contact hole 455 may be formed. The second contact plugs 462 may be formed by forming a first conductive layer on the exposed top surfaces of the active regions, the first bit line structures, and the second insulating interlayer 450 to sufficiently fill the second contact holes 455, and by removing an upper portion of the first conductive layer. The first conductive layer may be formed to include, e.g., doped polysilicon.

Metal silicide patterns (not shown) may be further formed on top surfaces of the second contact plugs 462, thereby reducing a resistance between the second contact plugs 462 and landing pads 472 (refer to FIGS. 44 and 45) subsequently formed.

Figure 42:
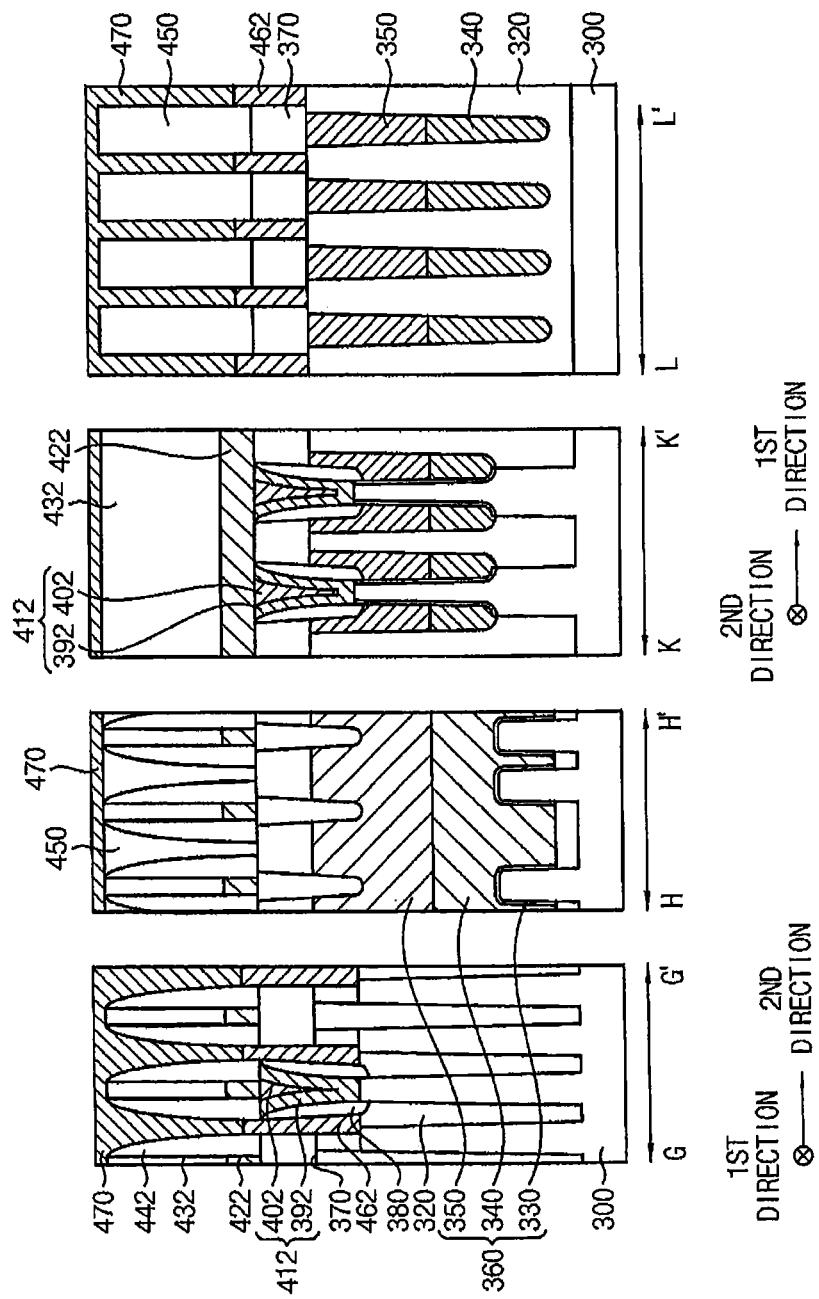

Referring to FIG. 42, a second conductive layer 470 may be formed on the second contact plugs 462, the first bit line structures and the second insulating interlayer 450 to sufficiently fill remaining portions of the second contact holes 455. The second conductive layer 470 may be formed to include a metal, e.g., tungsten, aluminum, copper, etc.

Alternatively, after a third conductive layer (not shown) is formed on the second contact plugs 462, the first bit line structures, and the second insulating interlayer 450 to sufficiently fill remaining portions of the second contact holes 455, an upper portion of the third conductive layer may be planarized until top surfaces of the first bit line structures and the second insulating interlayer 450 may be exposed to form contact plugs (not shown), and a fourth conductive layer (not shown) serving as a pad layer may be formed on the contact plugs, the first bit line structures and the second insulating interlayer 450. Hereinafter, only the case in which the second conductive layer 470 (serving as both of the contact plug and the pad layer) is formed will be illustrated.

Figure 43:
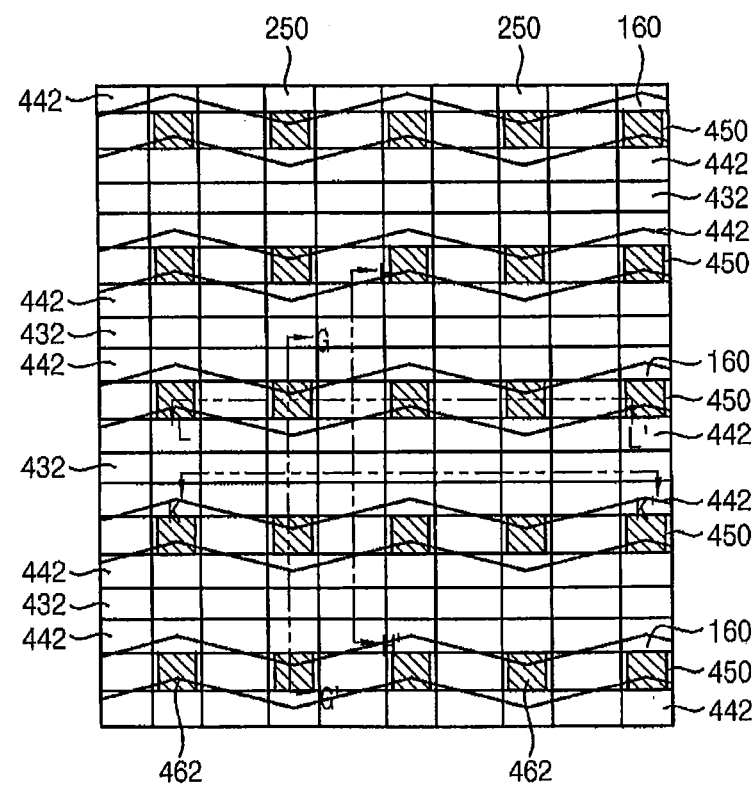

Referring to FIG. 43, processes substantially the same as or similar to those illustrated with reference to FIGS. 1 to 23 may be performed. That is, a DPT process using the first photoresist pattern 160 extending in a waveform along the first direction and a DPT process using the second photoresist pattern 250 extending in a straight line in the second direction may be sequentially performed to pattern an upper portion of the second conductive layer 470.

Figure 45:
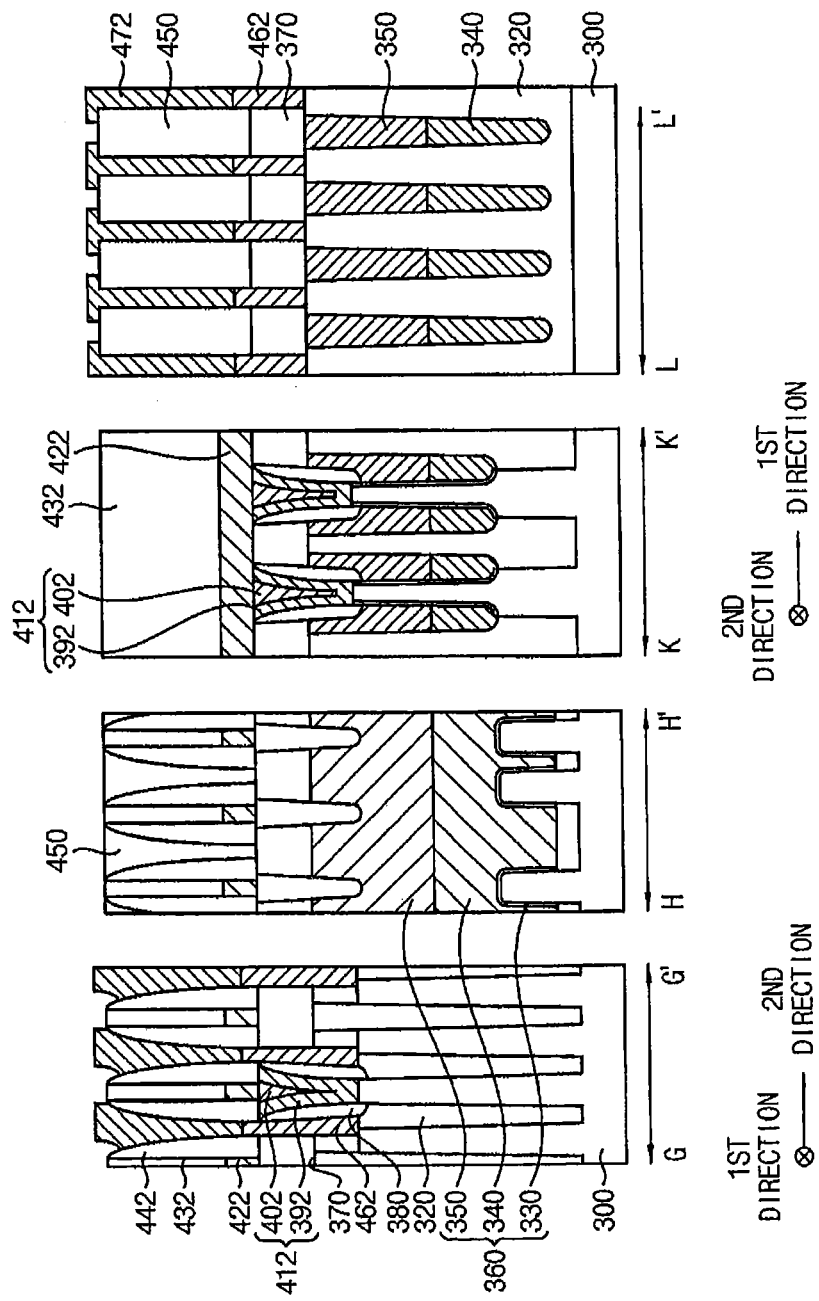

Thus, referring to FIGS. 44 and 45, the landing pads 472 (each of which may include an upper portion having the shape of the pads 102 in FIG. 24) may be formed. A lower portion of each landing pad 472 may contact a top surface of each second contact plug 462.

Figure 46:
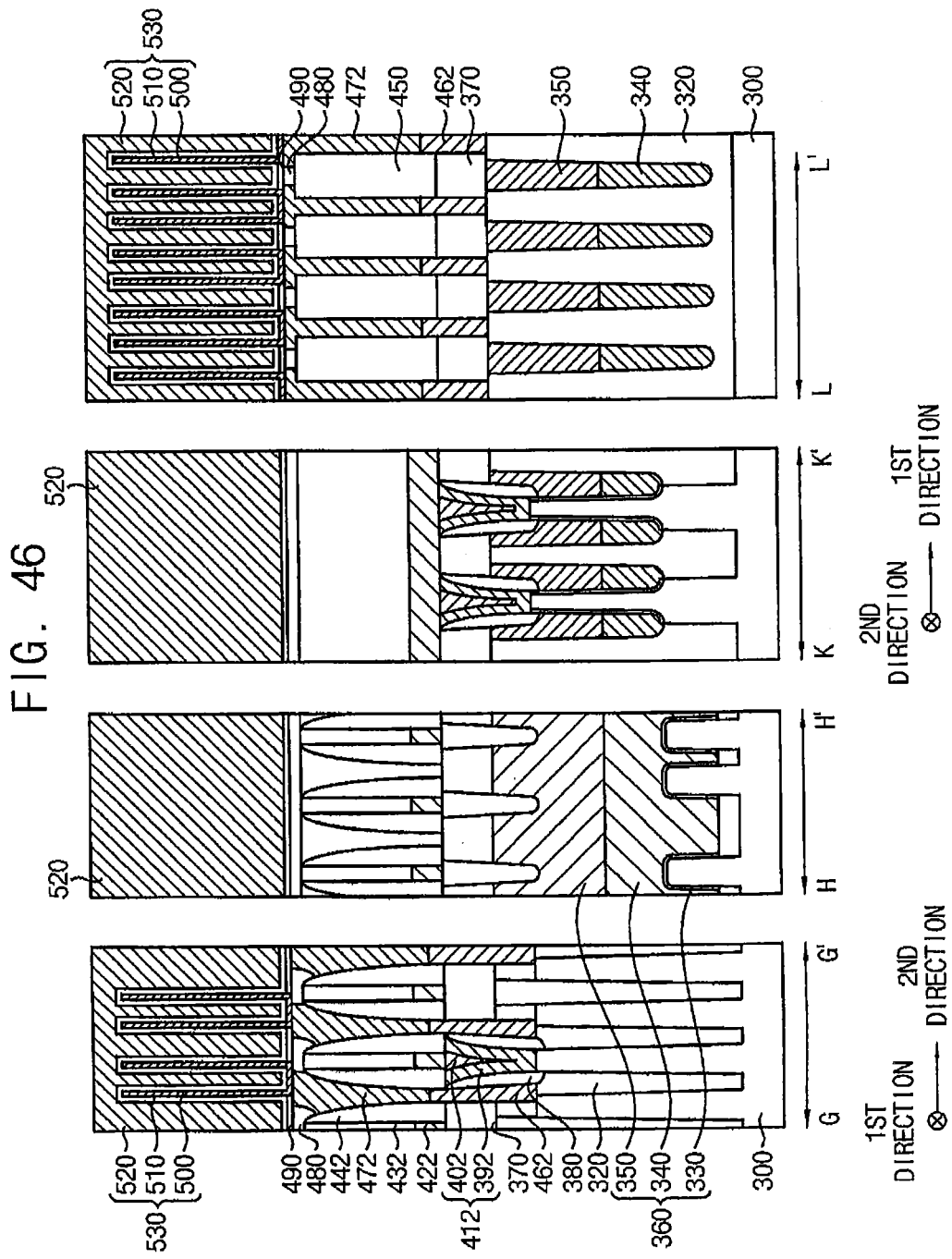

Referring to FIG. 46, capacitors 530 contacting the landing pads 472, respectively, may be formed to complete the semiconductor device.

That is, a third insulating interlayer 480 may be formed on the first bit line structures and the second insulating interlayer 450 to cover the landing pads 472, an upper portion of the third insulating interlayer 480 may be planarized until a top surface of the landing pads 472 may be exposed. An etch stop layer 490 and a mold layer (not shown) may be sequentially formed on the third insulating interlayer 480 and the landing pads 472, and may be partially etched to form third contact holes (not shown) exposing top surfaces of the landing pads 472, respectively. In the etching process, a top surface of the third insulating interlayer 480 may also be partially exposed. In example embodiments, the third contact holes may form a honeycomb structure. That is, the third contact holes may be formed at positions corresponding to vertices and centers of hexagons when viewed from a top side.

After a lower electrode layer is formed on sidewalls of the third contact holes, the exposed top surfaces of the landing pads 472, the exposed top surface of the third insulating interlayer 480, and the mold layer, a sacrificial layer (not shown) may be formed on the lower electrode layer to sufficiently fill remaining portions of the third contact holes, and upper portions of the sacrificial layer and the lower electrode layer may be planarized until a top surface of the mold layer is exposed to divide the lower electrode layer into a plurality of pieces. The sacrificial layer and the mold layer may be removed. Thus, a plurality of cylindrical lower electrodes 500 may be formed on the sidewalls of the third contact holes, the exposed top surfaces of the landing pads 472, and the exposed top surface of the third insulating interlayer 480, and the lower electrodes 500 may form a honeycomb structure in accordance with the honeycomb structure of the third contact holes. Alternatively, a plurality of pillar-shaped lower electrodes may be formed instead of the plurality of cylindrical lower electrodes 500, and in this case, the lower electrode layer may entirely fill the third contact holes and the sacrificial layer may not be formed. Hereinafter, only the case in which the cylindrical lower electrodes 500 are formed will be illustrated.

A dielectric layer 510 may be formed on the lower electrodes 500 and the etch stop layer 490, and an upper electrode 520 may be formed on the dielectric layer 510 to form the capacitors 530, each of which may include the lower electrode 500, the dielectric layer 510, and the upper electrode 520. The lower and upper electrodes 500 and 520 may be formed to include doped polysilicon, a metal, a metal nitride, etc., and the dielectric layer 510 may be formed to include a metal oxide, silicon oxide, etc.

Figure 47:
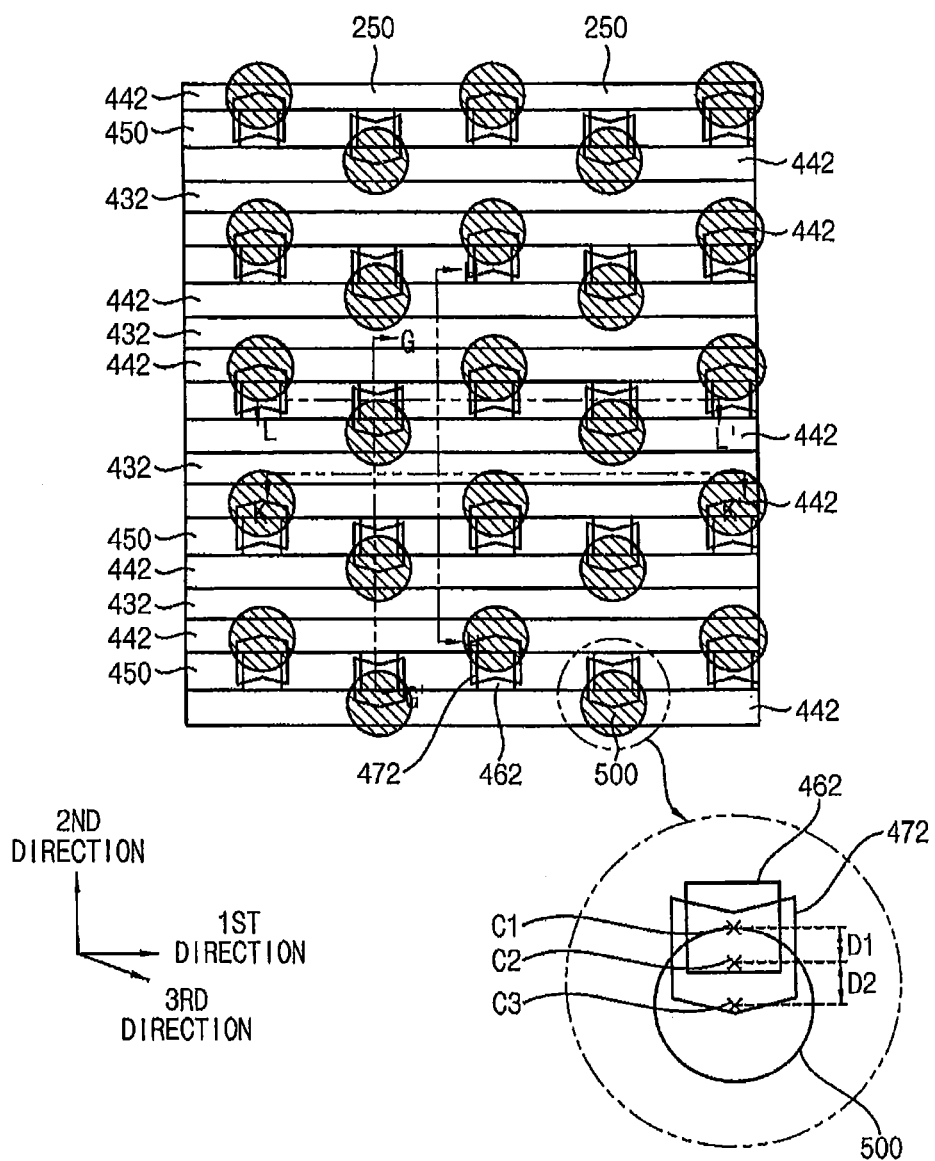

FIG. 47 is a plan view illustrating locations of the second contact plugs 462, the landing pads 472, and the lower electrodes 500 in the semiconductor device of FIG. 46. In FIG. 47, only shapes of the upper portions of the landing pads 472 are shown.

Referring to FIG. 47, the second contact plugs 462 may be arranged at a given distance from each other in the first direction between the second spacers 442 of the first bit line structures, and the landing pads 472 may be formed to contact top surfaces of the second contact plugs 462, respectively. The landing pads 472 may be disposed in the first direction in a waveform that may fluctuate toward the second direction. That is, the landing pads 472 may be disposed in a zigzag fashion in the first direction. Thus, when viewed from a top side, a second center C2 of each landing pad 472 may not be coincident with a first center C1 of the corresponding second contact plug 462, and may be spaced apart from the first center C1 by a first distance D1.

The lower electrodes 500 may be arranged in a honeycomb structure in consideration of making best use of space and avoiding mutual interference therebetween. That is, the lower electrodes 500 may be arranged at positions corresponding to vertices and centers of hexagons when viewed from a top side. Thus, the positions of the lower electrodes 500 may be different from those of the second contact plugs 462 when viewed from a top side. In order to electrically connect the second contact plugs 462 with the lower electrodes 500, the landing pads 472 may be formed therebetween. In example embodiments, the second center C2 of each landing pad 472 may be located between the first center C1 of each second contact plug 462 and a third center C3 of each lower electrode 500, when viewed from a top side.

If the landing pads 472 are formed in a honeycomb structure like the lower electrodes 500, and thus the second center C2 of each landing pad 472 may be coincident with the third center C3 of the corresponding lower electrode 500, resistance between the landing pads 472 and the second contact plugs 462 may be high due to the small contact area therebetween. However, in accordance with example embodiments, the second center C2 of each landing pad 472 may be located between the first center C1 of each second contact plug 462 and the third center C3 of each lower electrode 500, and thus resistance between the landing pads 472 and the second contact plugs 462 may be reduced.

If the landing pads 472 are formed such that the second center C2 of each landing pad 472 may be coincident with the first center C1 of the corresponding second contact plug 462, the resistance between the landing pads 472 and the lower electrodes 500 may be relatively high due to the small contact area therebetween. However, in accordance with example embodiments, second center C2 of each landing pad 472 may be located between the first center C1 of each second contact plug 462 and the third center C3 of each lower electrode 500, and thus resistance between the landing pads 472 and the lower electrodes 500 may be reduced.

That is, according to the first distance D1 between the second center C2 of each landing pad 472 and the first center C1 of each second contact plug 462, and a second distance D2 between the second center C2 of each landing pad 472 and the third center C3 of each lower electrode 500, resistance between the landing pads 472 and the second contact plugs 462 and resistance between the landing pads 472 and the lower electrodes 500 may be changed. In example embodiments, the locations of the landing pads 472 may be controlled by changing the fluctuation amplitude of the first photoresist pattern 160 toward the second direction, so that the first and second distances D1 and D2 may be easily controlled. Thus, in accordance with example embodiments, the resistance between the landing pads 472 and the second contact plugs 462 and the resistance between the landing pads 472 and the lower electrodes 500 may be controlled by changing the relative locations of the second contact plugs 462, the landing pads 472, and the lower electrodes 500.

Figure 48:
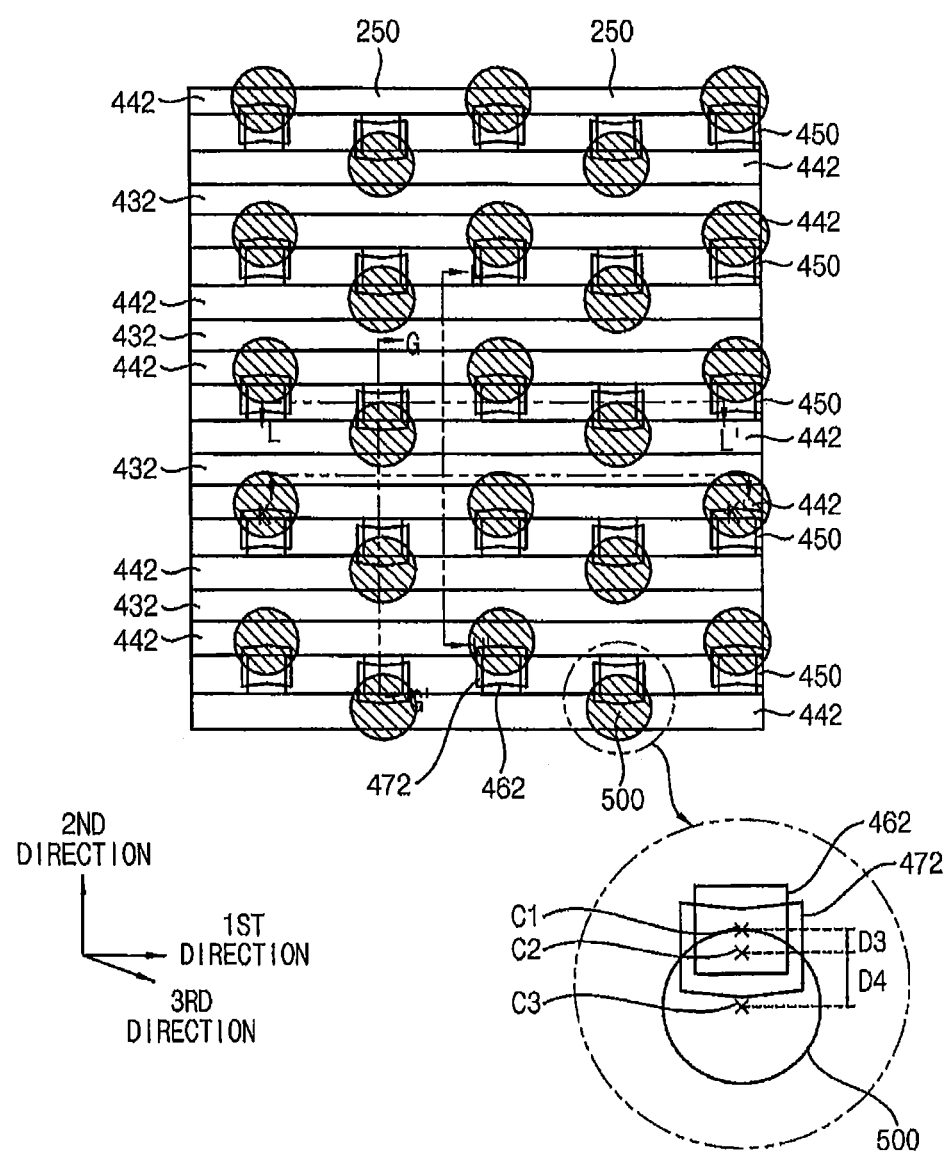
Figure 49:
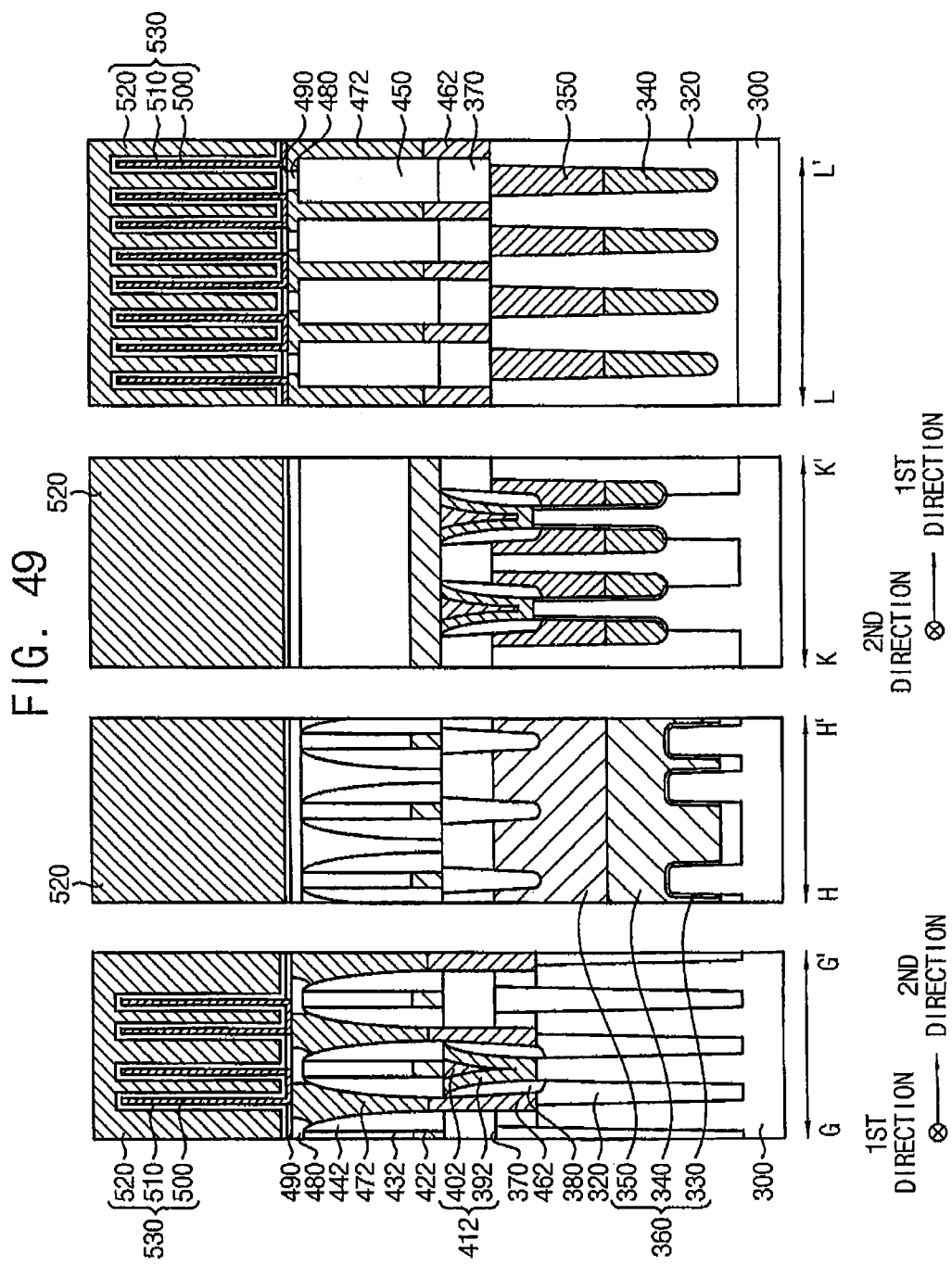

FIG. 48 is a plan view illustrating the locations of the second contact plugs 462, the landing pads 472, and the lower electrodes 500 in the semiconductor device in accordance with other example embodiments. FIG. 49 is a cross-sectional view of the semiconductor device in FIG. 48.

Referring to FIGS. 48 and 49, a third distance D3 between the second center C2 of each landing pad 472 and the first center C1 of the corresponding second contact plug 462 is smaller than the first distance D1 in the semiconductor device of FIG. 47, and a fourth distance D4 between the second center C2 of each landing pad 472 and the third center C3 of the corresponding lower electrode 500 is larger than the second distance D2 in the semiconductor device of FIG. 47. Thus, resistance between the landing pads 472 and the second contact plugs 462 and resistance between the landing pads 472 and the lower electrodes 500 in the semiconductor device of FIGS. 48 and 49 may be different from those of the semiconductor device of FIG. 47.

As illustrated above, in accordance with example embodiments, a desired layout of the landing pads may be implemented by performing a DPT process only twice.

Present inventive concepts may be applied to various types of semiconductor devices including pattern structures, e.g., pads, masks, wirings, etc. For example, present inventive concepts may be applied to forming capacitor landing pads in a cell region or bit lines in a peripheral circuit region in a DRAM device including planar transistors, or forming active patterns in a DRAM device including vertical channel transistors. In the latter case, after forming a mask layer on a substrate, the mask layer may be patterned by the method of forming pads illustrated with reference to FIGS. 1 to 26 to form a plurality of masks. An upper portion of the substrate may be etched using the plurality of masks as an etching mask to form active patterns.

As discussed herein, a pad may be a conductive landing pad providing electrical coupling between a memory cell capacitor and a source/drain region of a memory cell access transistor. More particularly, the conductive landing pad may provide electrical coupling to an electrode of the memory cell capacitor. According to some other embodiments, the pad may be a conductive landing pad providing electrical coupling between a bit line and a source/drain region(s) of a memory cell access transistor(s). According to still other embodiments, the pad may be a portion of a capacitor electrode or any other electrode. According to yet other embodiments, the pad may be any other conductive pattern.

According to some embodiments discussed above with respect to FIG. 1-23, a method of forming an electronic device may include providing a pad layer 100 on a substrate 99, and forming first masks 172 on the pad layer, wherein the first masks 172 are spaced apart. Each of the first masks 172 may define a non-linear pattern extending along a respective axis in a first direction. Second masks 262 may be formed on the pad layer 100 extending in a second direction different than the first direction, and each of the second masks 262 crosses each of the first masks 172. The pad layer 100 may be patterned using the first masks 172 and the second masks 262 to form pads 102 on the substrate, so that the pads 102 are completely spaced apart in all directions such that they do not physically contact each other as shown in FIG. 24.

Forming the first masks 172 may precede forming the second masks 262. Moreover, patterning the pad layer 100 may include patterning the first masks 172 using the second masks 262, removing the second masks 262 to provide a plurality of pad masks 174 after patterning the first masks 172, patterning the pad layer 100 using the plurality of pad masks 174 to form pads 102, and removing the pad masks 174 after patterning the pad layer.

Figure 50:
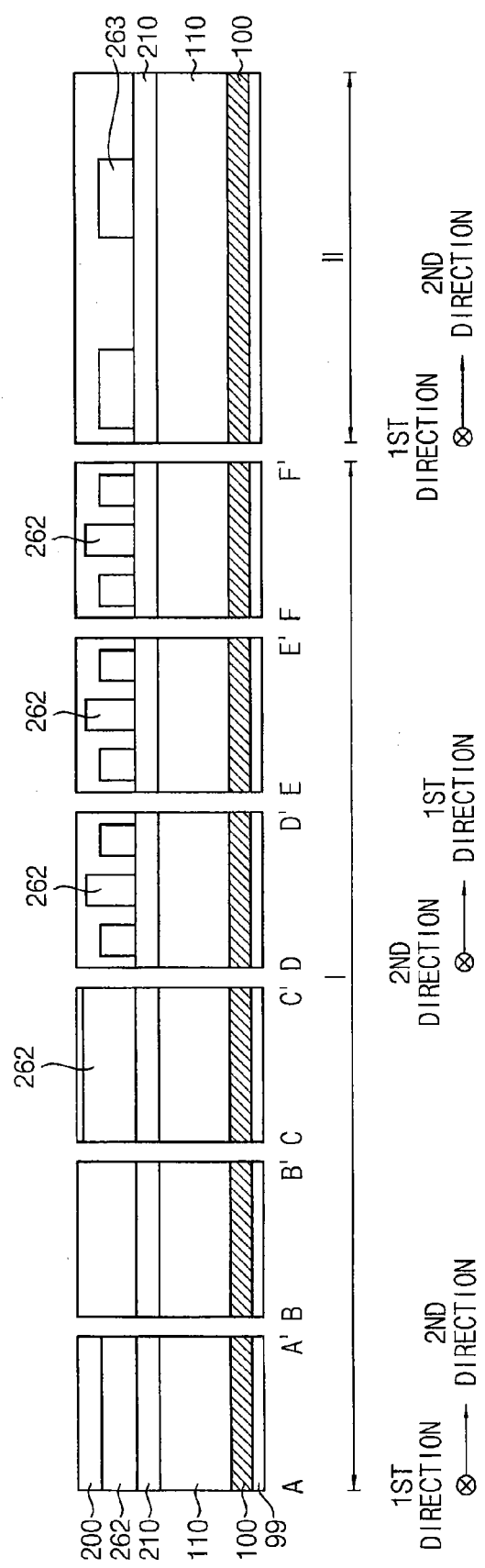
FIGS. 50 and 51 are cross-sectional views illustrating stages of a method of manufacturing a semiconductor device in accordance with example embodiments.
Figure 51:
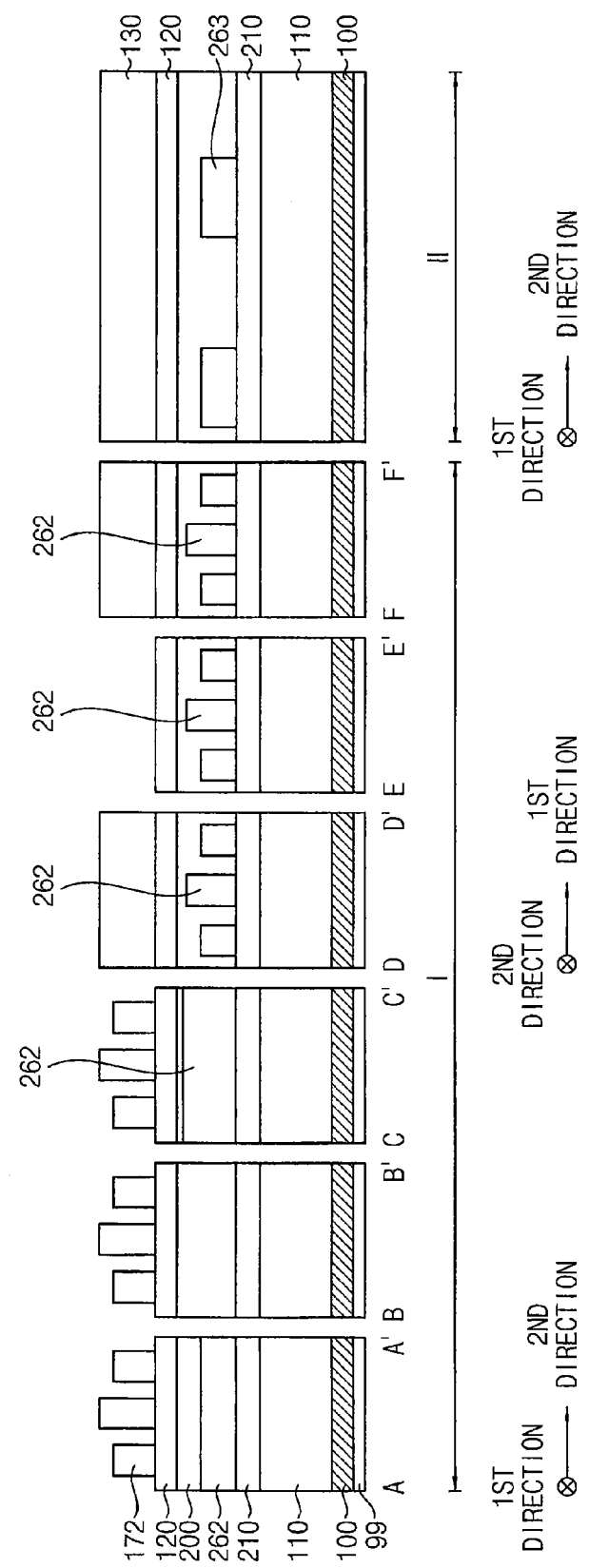

According to some other embodiments, the order of forming the first masks 172 and the second masks 262 may be reversed, so that forming the second masks 262 may precede forming the first masks 172. According to such embodiments, second masks 262 may be formed on pad layer 100 as shown in FIG. 50 using operations discussed above with respect to FIGS. 9-15, and planarization layer 200 may be formed on second masks 262. Then, first masks 172 may be formed on second masks 262 and planarization layer 200 as shown in FIG. 51 using operations discussed above with respect to FIGS. 1-8. In such embodiments, patterning the pad layer 100 may include patterning the second masks 262 using the first masks 172, removing the first masks 172 to provide pad masks 174 after patterning second masks 262, patterning the pad layer 100 using the pad masks 174 to form the pads 102, and removing the pad masks 174 after patterning the pad layer 100.

While example embodiments have been particularly shown and described, it will be understood by one of ordinary skill in the art that variations in form and detail may be made therein without departing from the spirit and scope of the claims.

That which is claimed is:

1. A method of forming an electronic device, the method comprising:
    providing a pad layer on a substrate;
    forming first masks on the pad layer, wherein the first masks are spaced apart, wherein each of the first masks defines a non-linear pattern extending along a respective axis in a first direction;

forming second masks on the pad layer extending in a second direction different than the first direction, wherein the second masks are spaced apart, wherein each of the second masks crosses each of the first masks; and patterning the pad layer using the first masks and the second masks to form pads on the substrate, wherein the pads are spaced apart so that the pads are completely spaced in all directions such that they do not physically contact each other.

2. The method of claim 1 wherein forming the first masks precedes forming the second masks.

3. The method of claim 2 wherein patterning the pad layer comprises, patterning the first masks using the second masks;

after patterning the first masks, removing the second masks to provide pad masks wherein the pad masks are spaced apart, patterning the pad layer using the pad masks to form the pads, and after patterning the pad layer, removing the pad masks.

4. The method of claim 1 wherein forming the second masks precedes forming the first masks.

5. The method of claim 4 wherein patterning the pad layer comprises, patterning the second masks using the first masks;

after patterning the second masks, removing the first masks to provide pad masks wherein the pad masks are spaced apart, patterning the pad layer using the pad masks to form the pads, and after patterning the pad layer, removing the pad masks.

6. The method of claim 1 wherein each of the second masks is linear crossing the first masks.

7. The method of claim 1 wherein each of the second masks has a non-linear pattern crossing the first masks.

8. The method of claim 1 wherein the non-linear pattern is a periodic pattern extending along the respective axis in the first direction.

9. The method of claim 8 wherein each of the second masks crosses each of the first masks at a respective maximum deviation of the first mask from the respective axis.

10. The method of claim 1 wherein forming the first masks comprises, forming first patterns on a mask layer, wherein the first patterns are spaced apart, and after forming the first patterns, forming second patterns on the mask layer wherein the second patterns are self-aligned with the first patterns, wherein each of the second patterns is spaced apart from each of the first patterns in a direction parallel with respect to a surface of the pad layer, and wherein the surface of the pad layer is between the pad layer and the first masks, and after forming the second patterns, patterning the mask layer using the first and second patterns to form the first masks.

11. The method of claim 1 wherein the substrate includes memory cell transistors, and wherein each of the pads is electrically coupled to a source/drain region of a respective one of the memory cell transistors, the method further comprising:

after forming the pads, forming memory cell capacitors wherein each of the memory cell capacitors is electrically coupled to a respective one of the pads.

12. The method of claim 1 wherein the second direction is perpendicular with respect to the first direction.

13. A method of forming an electronic device, the method comprising:

providing a pad layer on a substrate;

forming first masks on the pad layer extending in a first direction, wherein the first masks are spaced apart on the pad layer, and wherein forming the first masks comprises, forming first patterns on a mask layer, wherein the first patterns are spaced apart, after forming the first patterns, forming second patterns on the mask layer wherein the second patterns are self-aligned with the first patterns, wherein each of the second patterns is spaced apart from each of the first patterns in a direction parallel with respect to a surface of the pad layer, and wherein the surface of the pad layer is between the pad layer and the first patterns, and after forming the second patterns, patterning the mask layer using the first and second patterns to form the first masks;

forming second masks on the pad layer extending in a second direction different than the first direction, wherein each of the second masks crosses each of the first masks; and patterning the pad layer using the first masks and the second masks to form pads on the substrate wherein the pads are spaced apart.

14. The method of claim 13 wherein each of the first masks defines a non-linear pattern extending along a respective axis in the first direction, and wherein each of the second masks defines a linear pattern extending along a respective axis in the second direction.

15. The method of claim 13 wherein each of the first masks defines a linear pattern extending along a respective axis in the first direction, and wherein each of the second masks defines a non-linear pattern extending along a respective axis in the second direction.

16. The method of claim 13 wherein each of the first masks defines a linear pattern extending along a respective axis in the first direction, and wherein each of the second masks defines a linear pattern extending along a respective axis in the second direction.

17. The method of claim 13 wherein each of the first masks defines a non-linear pattern extending along a respective axis in the first direction, and wherein each of the second masks defines a non-linear pattern extending along a respective axis in the second direction.

18. The method of claim 13 wherein forming the first masks precedes forming the second masks, and wherein patterning the pad layer comprises, patterning the first masks using the second masks, after patterning the first masks, removing the second masks to provide pad masks, patterning the pad layer using the pad masks to form the pads, and after patterning the pad layer, removing the pad masks.

19. The method of claim 13 wherein forming the second masks precedes forming the first masks, and wherein patterning the pad layer comprises, patterning the second masks using the first masks, after patterning the second masks, removing the first masks to provide pad masks, patterning the pad layer using the pad masks to form the pads, and after patterning the pad layer, removing the pad masks.

20. The method of claim 13 wherein the substrate includes memory cell transistors, and wherein each of the pads is electrically coupled to a source/drain region of a respective one of the memory cell transistors, the method further comprising:

after forming the pads, forming memory cell capacitors wherein each of the memory cell capacitors is electrically coupled to a respective one of the pads.

21. The method of claim 13 wherein the second direction is perpendicular with respect to the first direction.

22. The method of claim 13 wherein forming the second masks comprises, forming third patterns on a second mask layer, after forming the third patterns, forming fourth patterns on the second mask layer wherein the fourth patterns are self-aligned with the third patterns, wherein each of the fourth patterns is spaced apart from each of the third patterns in a second direction that is parallel with respect to the surface of the pad layer, and wherein the surface of the pad layer is between pad layer and the third patterns, and after forming the fourth patterns, patterning the second mask layer using the third and fourth patterns to form the second masks.

* * * * *